United States Patent
Yanase et al.

(10) Patent No.: US 11,139,804 B2
(45) Date of Patent: Oct. 5, 2021

(54) CIRCUIT INCLUDING FLIP-FLOP AND CONTROL ELEMENT

(71) Applicant: Tianma Japan, Ltd., Kanagawa (JP)

(72) Inventors: Jiro Yanase, Kanagawa (JP); Masamichi Shimoda, Kanagawa (JP); Yoshihiro Nonaka, Kanagawa (JP)

(73) Assignees: TIANMA JAPAN, LTD., Kawasaki (JP); WUHAN TIANMA MICRO-ELECTRONICS CO., LTD., Wuhan (CN)

(*) Notice: Subject to any disclaimer, the term of this patent is extended or adjusted under 35 U.S.C. 154(b) by 0 days.

(21) Appl. No.: 16/891,169

(22) Filed: Jun. 3, 2020

(65) Prior Publication Data
US 2020/0389157 A1 Dec. 10, 2020

(30) Foreign Application Priority Data

Jun. 4, 2019 (JP) .............................. JP2019-104367
Feb. 19, 2020 (JP) .............................. JP2020-026537

(51) Int. Cl.
*H03K 3/356* (2006.01)
*G09G 3/3266* (2016.01)
(Continued)

(52) U.S. Cl.
CPC ..... *H03K 3/356147* (2013.01); *G09G 3/3266* (2013.01); *G11C 19/28* (2013.01);
(Continued)

(58) Field of Classification Search
CPC ......... G11C 19/28; G11C 5/148; G11C 5/147; G11C 7/1057; G11C 7/1084; H03K 3/356104; H03K 19/0002; H03K 3/012; H03K 3/35625; H03K 19/00315; H03K 19/018507; H03K 19/018521;
(Continued)

(56) References Cited

U.S. PATENT DOCUMENTS 7,436,923 B2 * 10/2008 Tobita .................. G09G 3/3677
377/64
8,781,059 B2 * 7/2014 Kikuchi ................. G11C 19/28
377/64

(Continued)

FOREIGN PATENT DOCUMENTS

JP      2001-351503 A    12/2001
JP      2009-141396 A     6/2009

*Primary Examiner* — Vibol Tan
(74) *Attorney, Agent, or Firm* — Sughrue Mion, PLLC

(57) ABSTRACT

A circuit includes a flip-flop included in a multi-stage shift register and a control element. The flip-flop includes an output field-effect transistor, a first field-effect transistor configured to operate to supply one of a high potential and a low potential to the gate of the output field-effect transistor, and a second field-effect transistor configured to operate to supply the other one of the high potential and the low potential to the gate of the output field-effect transistor. The control element is configured to operate to make an electric current flow between the gate and a power supply in the opposite direction of an off-leakage current from at least either one of the first field-effect transistor and the second field-effect transistor in a period where the first field-effect transistor and the second field-effect transistor are off.

15 Claims, 32 Drawing Sheets

(51) Int. Cl.
*G11C 19/28* (2006.01)
*H03K 3/012* (2006.01)
*H03K 19/096* (2006.01)

(52) U.S. Cl.
CPC ....... *H03K 3/012* (2013.01); *H03K 3/356104* (2013.01); *H03K 19/096* (2013.01); *G09G 2300/0426* (2013.01); *G09G 2300/0857* (2013.01); *G09G 2310/0278* (2013.01); *G09G 2310/0286* (2013.01)

(58) Field of Classification Search
CPC ............ H03K 17/687; H03K 19/0016; H03K 19/0175; H03K 19/0948; H03K 3/02335; H03K 3/356113; H03K 3/356147; H03K 3/356182; H03K 3/356095; G09G 2310/0286; G09G 2310/0278; G09G 2310/06; G09G 3/3266; G09G 2300/0857; G09G 2300/0426; G09G 2340/0435; G09G 3/3233; G09G 2320/0295

See application file for complete search history.

(56) References Cited

U.S. PATENT DOCUMENTS

| | | | | |
|---|---|---|---|---|
| 2019/0372563 A1* | 12/2019 | Mao | ........................ | H03K 3/012 |
| 2020/0035156 A1* | 1/2020 | Yanase | ................ | H01L 27/3276 |
| 2020/0335044 A1* | 10/2020 | Kawachi | .............. | G09G 3/3275 |

* cited by examiner

COMPARATIVE EXAMPLE

SIGNAL WAVEFORMS OF OVERLAP SCANNING VSR

CIRCUIT INCLUDING FLIP-FLOP AND CONTROL ELEMENT

CROSS-REFERENCE TO RELATED APPLICATIONS

This non-provisional application claims priority under 35 U.S.C. § 119(a) on Patent Application No. 2019-104367 filed in Japan on Jun. 4, 2019 and Patent Application No. 2020-26537 filed in Japan on Feb. 19, 2020, the entire contents of which are hereby incorporated by reference.

BACKGROUND

This disclosure relates to a circuit including a flip-flop and a control element.

For mobile display devices to be mounted on smartphones and tablet terminals, low-frequency driving is proposed to save power consumption. As the frame frequency of the display device becomes lower, the power consumption of the display device decreases.

Liquid crystal display devices (LCDs) and organic light-emitting diode (OLED) display devices are widely used as mobile display devices. These display devices include a shift register for driving (selecting) scanning lines. Further, there are OLED display devices that measure the characteristics of elements (such as driving TFTs and OLEDs) in the display device and adjust a data signal based on the measurement results. Such OLED display devices that perform external compensation on the data signal include a shift register for outputting a control signal for the measurement.

SUMMARY

A circuit according to an aspect of this disclosure includes a flip-flop included in a multi-stage shift register, and a control element. The flip-flop includes an output field-effect transistor, a first field-effect transistor configured to operate to supply one of a high potential and a low potential to the gate of the output field-effect transistor, and a second field-effect transistor configured to operate to supply the other one of the high potential and the low potential to the gate of the output field-effect transistor The control element is configured to operate to make an electric current flow between the gate and a power supply in the opposite direction of an off-leakage current from at least either one of the first field-effect transistor and the second field-effect transistor in a period where the first field-effect transistor and the second field-effect transistor are off.

It is to be understood that both the foregoing general description and the following detailed description are exemplary and explanatory and are not restrictive of this disclosure.

EMBODIMENTS

Figure 1:
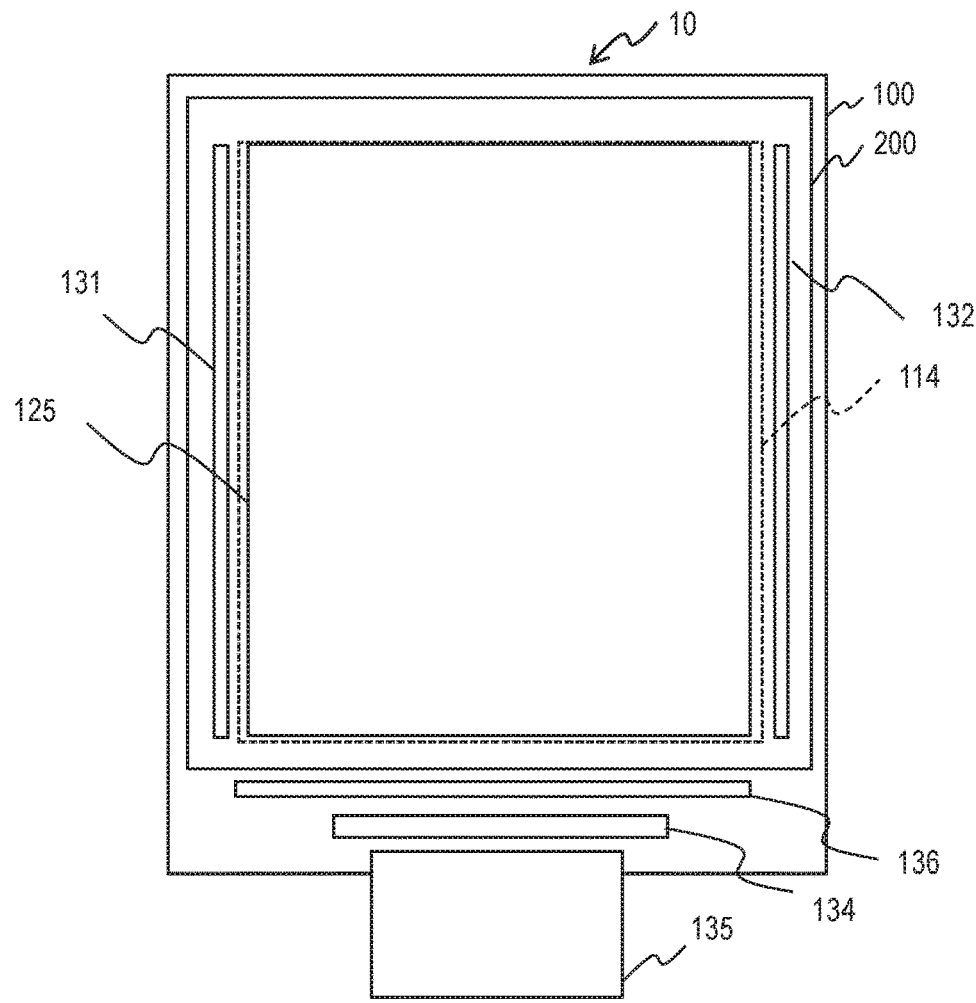
FIG. 1 schematically illustrates a configuration example of an OLED display device.

Hereinafter, embodiments of this disclosure will be described with reference to the accompanying drawings. It should be noted that the embodiments are merely examples to implement this disclosure and not to limit the technical scope of this disclosure.

Overview

Described hereinafter are circuit configurations applicable to a shift register for a display device such as a liquid crystal display device (LCD) or an organic light-emitting diode (OLED) display device. The shift registers disclosed in the following can be used in a device different from display devices.

In a shift register, the potential of a node connected with the gate of the output transistor is changed to a high potential (or a low potential) in the period after data is input until the data is output. To electrically connect the node with either a high-potential power supply or a low-potential power supply all the time, the node needs to be complementarily connected to the power supplies through a complementary metal-oxide semiconductor (CMOS) including both of an n-channel transistor and a p-channel transistor.

However, manufacturing a CMOS includes a large number of manufacturing steps and costs high. A shift register circuit including only either n-channel transistors or p-channel transistors can be manufactured at low cost but this circuit has a period in which the node connected with the gate of the output transistor is in a floating state such that the node is not supplied with any power supply potential. The potential of the node in the floating state could vary; the shift register may become unstable to operate wrongly. Particularly under the aforementioned low-frequency driving, the floating period becomes longer to increase the probability of erroneous operation. Therefore, existing techniques cannot satisfy both of the conditions of "low manufacturing cost" and "stable operation of the circuit for all the time".

In the circuits including a shift register described hereinafter, there exists a period for which the gate of an output transistor is supplied with neither a high potential nor a low potential via a transistor in an ON state. As will be described more specifically, off-leakage current from the transistor to supply the high potential or the low potential to the gate of the output transistor in this period could change the potential of the gate of the output transistor to cause erroneous operation.

The circuits described in the following control the current between the gate of the output transistor and a specific power supply to diminish this change of the gate potential caused by off-leakage current. As a result, the probability of erroneous operation of the shift register decreases.

In general, a shift register formed on a substrate includes low-temperature polysilicon thin film transistors (TFTs) to achieve a small channel size and high integration. Low-temperature polysilicon TFTs generate high off-leakage current. Further, the aforementioned period is longer in the case of low-frequency driving. Accordingly, the circuit configurations disclosed hereinafter are particularly advantageous for such a display device.

Hereinafter, the embodiments are described specifically with reference to the drawings. Elements common to the drawings are denoted by the same reference signs and some elements in the drawings are exaggerated in size or shape for clear understanding of description.

Embodiment 1

Overall Configuration

FIG. 1 schematically illustrates a configuration example of an OLED display device 10. Although the OLED display device is described by way of example of a device to which the circuit configurations of this disclosure are applied, the circuit configurations of this disclosure are applicable to other types of display devices and devices different from display devices. The OLED display device 10 includes a thin film transistor (TFT) substrate 100 on which OLED elements are formed and a structural encapsulation unit 200 for encapsulating the OLED elements.

In the periphery of a cathode electrode forming region 114 outer than the display region 125 of the TFT substrate 100, a scanning driver 131, an element measurement circuit 132, a driver IC 134, and a demultiplexer 136 are provided. The scanning driver 131 drives scanning lines on the TFT substrate 100. The element measurement circuit 132 drives measurement control lines to measure the characteristics of the elements such as organic light-emitting elements and TFTs.

The driver IC 134 is connected to the external devices via flexible printed circuits (FPC) 135. The driver IC 134 is mounted with an anisotropic conductive film (ACF), for example.

The driver IC 134 provides power and timing signals (control signals) to the scanning driver 131 and the element measurement circuit 132 and further, provides power and a data signal to the demultiplexer 136. The demultiplexer 136 outputs output of one pin of the driver IC 134 to d data lines in series (d is an integer more than 1). The demultiplexer 136 changes the output data line for the data signal from the driver IC 134 d times per scanning period to drive d times as many data lines as output pins of the driver IC 134.

Configuration of Pixel Circuit

Figure 2:
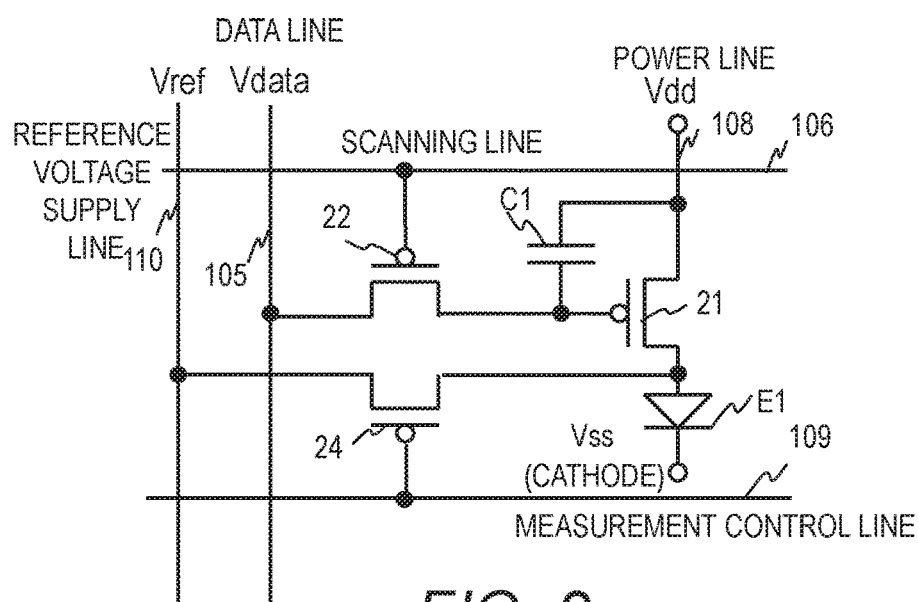
FIG. 2 illustrates a configuration example of a pixel circuit.

A plurality of pixel circuits are formed on the substrate 100 to control electric current to be supplied to the anode electrodes of subpixels. FIG. 2 illustrates a configuration example of a pixel circuit. Each pixel circuit includes a driving transistor 21, a selection transistor 22, a measurement transistor 24, and a storage capacitor (capacitive element) C1. The pixel circuit controls light emission of an OLED element E1. The transistors are field-effect transistors and more specifically, TFTs.

The selection transistor 22 is a switch for selecting the sub-pixel. The selection transistor 22 is a p-channel TFT and its gate terminal is connected with a scanning line 106. The source terminal of the selection transistor 22 is connected with a data line 105. The drain terminal of the selection transistor 22 is connected with the gate terminal of the driving transistor 21.

The driving transistor 21 is a transistor (driving TFT) for driving the OLED element E1. The driving transistor 21 is a p-channel TFT and its gate terminal is connected with the drain terminal of the selection transistor 22. The source terminal of the driving transistor 21 is connected with a power line (Vdd) 108. The drain terminal of the driving transistor 21 is connected with the anode of the OLED element E1. The storage capacitor C1 is provided between the gate terminal and the source terminal of the driving transistor 21.

The measurement transistor 24 is a p-channel TFT and controls the electric connection between a reference voltage supply line 110 and the anode of the OLED element E1. This control is performed in accordance with a control signal supplied from a measurement control line 109 to the gate of the measurement transistor 24. The measurement transistor 24 is used to measure the characteristics of the driving transistor 21 and the OLED element E1.

Next, operation of the pixel circuit is described. The scanning driver 131 outputs a selection pulse to the scanning line 106 to turn on the selection transistor 22. The data voltage supplied from the driver IC 134 through the data line 105 is stored to the storage capacitor C1. The storage capacitor C1 holds the stored voltage during the period of one frame. The conductance of the driving transistor 21 changes in an analog manner in accordance with the stored voltage, so that the driving transistor 21 supplies a forward bias current corresponding to a light emission level to the OLED element E1.

The measurement transistor 24 can be used to measure a characteristic of the driving transistor 21. For example, the voltage-current characteristic of the driving transistor 21 can be accurately measured by measuring the current flowing from the power line (Vdd) 108 to the reference voltage supply line (Vref) 110 under the bias conditions selected so that the driving transistor 21 will operate in the saturated region and the measurement transistor 24 will operate in the linear region. If the differences in voltage-current characteristic among the driving transistors 21 for individual subpixels are compensated for by generating data signals at an external circuit, a highly-uniform display image can be attained.

In the meanwhile, the voltage-current characteristic of the OLED element E1 can be accurately measured by applying a voltage to light the OLED element E1 from the reference voltage supply line 110 when the driving transistor 21 is off and the measurement transistor 24 is operating in the linear region. In the case where the OLED element E1 is deteriorated because of long-term use, for example, if the deterioration is compensated for by generating a data signal at an external circuit, the display device can have a long life spun.

The circuit configuration in FIG. 2 is an example; the pixel circuit may have a different circuit configuration. Although the pixel circuit in FIG. 2 includes p-channel TFTs, the pixel circuit may employ n-channel TFTs.

The scanning driver 131 includes a shift register for serially selecting scanning lines 106. The element measurement circuit 132 also includes a shift register for serially selecting measurement control lines 109. The shift register described in the following can be used in either one or both of the scanning driver 131 and the element measurement circuit 132.

Circuit Configuration of Shift Register

Figure 3:
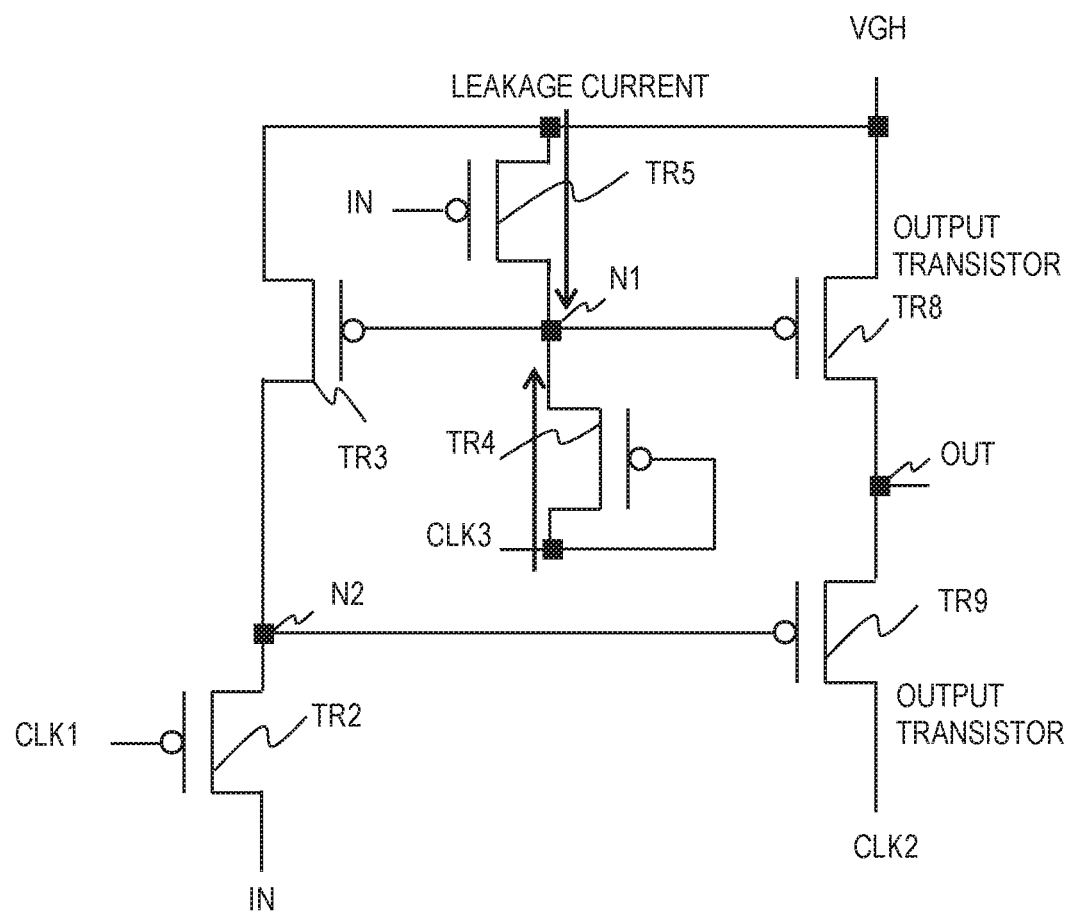
FIG. 3 schematically illustrates a circuit configuration of a flip-flop of a comparative example.

FIG. 3 schematically illustrates a circuit configuration of a shift register (flip-flop) included in a multi-stage shift register, as a comparative example. The flip-flop includes field-effect transistors (hereinafter, simply referred to as transistors) TR2, TR3, TR4, TR5, TR8, and TR9. These transistors are p-channel TFTs. The transistors in the flip-flop work as switches to be ON/OFF.

The inputs to the flip-flop are a high power-supply potential (high potential) VGH, an input signal IN from the previous flip-flop, and clock signals CLK1, CLK2, and CLK3. The input signal IN and the clock signals CLK1, CLK2, and CLK3 are changed between a high potential (high level) H equal to the high power-supply potential VGH and a low potential (low level) L. The high potential and the low potential in the shift register are fixed potentials.

A node OUT between the drain of the output transistor TR8 and the source of the output transistor TR9 outputs serially transferred data. The source of the output transistor TR8 is connected with a power line for supplying the high power-supply potential VGH. The drain of the output transistor TR9 is supplied with the clock signal CLK2. When the output transistor TR8 is ON, the node OUT outputs the high potential H. When the output transistor TR9 is ON, the node OUT outputs the clock signal CLK2. When the output transistor TR9 is ON, the clock signal CLK2 is at the low potential L.

The transistor TR5 (an example of the first field-effect transistor) is connected between the power line for supplying the high power-supply potential VGH (high potential H) and the gate of the output transistor TR8. In the example of FIG. 3, the drain of the transistor TR5 is connected with a node N1. The gate of the transistor TR5 is supplied with the input signal IN from the previous flip-flop. The transistor TR5 turns ON/OFF in accordance with the input signal IN; when the transistor TR5 is ON, the transistor TR5 supplies the high power-supply potential VGH (high potential H) to the gate of the output transistor TR8 to turn the transistor TR8 OFF.

The transistor TR4 (an example of the second field-effect transistor) supplies the clock signal CLK3 to the gate of the output transistor TR8. In the example of FIG. 3, one of the source and the drain of the transistor TR4 is connected with the gate of the transistor TR4. The remaining source or drain of the transistor TR4 is connected with the node N1. The source/drain (gate) of the transistor TR4 is supplied with the clock signal CLK3. The transistor TR4 supplies the clock signal CLK3 at the low potential L to the gate of the output transistor TR8 (to the node N1) to turn the output transistor TR8 ON. When the clock signal CLK3 is at the high potential H, the transistor TR4 is OFF and when the clock signal CLK3 is at the low potential L, the transistor TR4 is ON.

The transistor TR3 is connected between the power line for supplying the high power-supply potential VGH (high potential H) and the gate of the output transistor TR9. In the example of FIG. 3, the drain of the transistor TR3 is connected with a node N2. The gate of the transistor TR3 is supplied with the same potential as the node N1 (the gate of the output transistor TR8).

The transistor TR3 turns ON/OFF together with the output transistor TR8. When the transistor TR3 is ON, the transistor TR3 supplies the high potential H to the gate of the output transistor TR9 to turn the output transistor TR9 OFF.

The transistor TR2 supplies the input signal IN from the previous flip-flop to the gate of the output transistor TR9. In the example of FIG. 3, one of the source and the drain of the transistor TR2 is connected with the node N2. The remaining source or drain of the transistor TR2 is supplied with the input signal IN.

The transistor TR2 turns ON/OFF in accordance with the clock signal CLK1. When the transistor TR2 is ON, the transistor TR2 supplies the input signal IN to the gate of the output transistor TR9. The transistor TR2 supplies data (low potential) in the input signal IN transferred from the previous flip-flop to the output transistor TR9 for the period where the transistor TR2 is ON.

Figure 4:
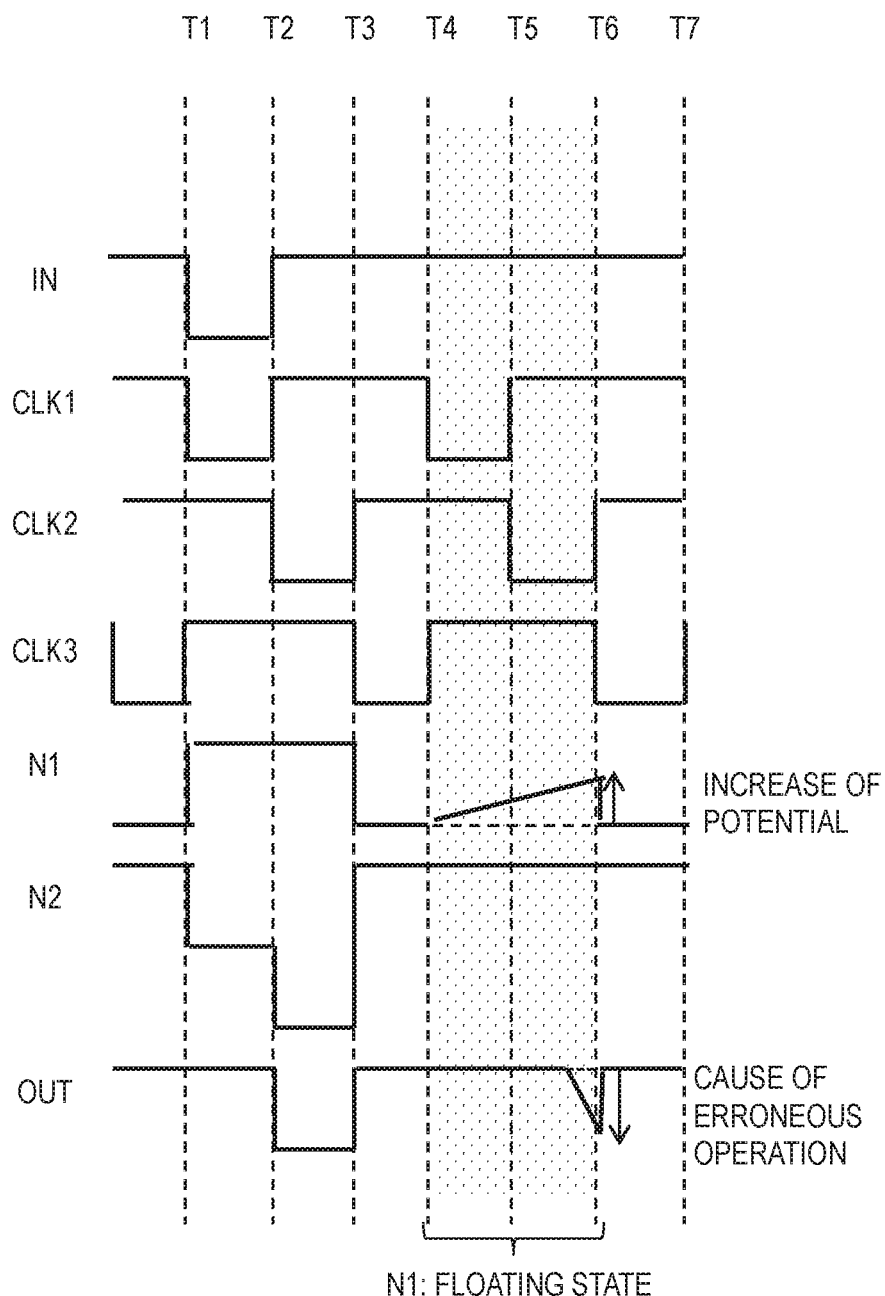
FIG. 4 is a timing chart of the circuit illustrated in FIG. 3.

FIG. 4 is a timing chart of the circuit illustrated in FIG. 3. First, the operation of the components at the time T1 is described. The input signal IN changes from the high potential H to the low potential L. For the input signal IN and the output signal at the node OUT (hereinafter, the output signal OUT), the low potential L is the potential of the data ("1" data) to be transferred and the high potential H is the base potential ("0" data) in relation to the data. Data (the low potential L in the input signal IN) is input from the previous flip-flop for the period from the time T1 to the time T2.

In response to the foregoing change of the input signal IN, the transistor TR5 turns ON. The potential of the node N1 changes from the low potential L to the high potential H, so that the output transistor TR8 turns OFF. The clock signal CLK3 changes from the low potential L to the high potential H, so that the transistor TR4 turns OFF.

Since the potential of the node N1 changes from the low potential L to the high potential H, the transistor TR3 turns OFF. The clock signal CLK1 changes from the high potential H to the low potential L, so that the transistor TR2 turns ON. Since the input signal IN changes from the high potential H to the low potential L, the potential of the node N2 changes from the high potential H to the low potential L. The clock signal CLK2 is at the high potential H. The output transistor TR9 turns ON. The output signal OUT keeps the high potential H.

Next, operation of the components at the time T2 is described. The input signal IN changes from the low potential L to the high potential H. The transistor TR5 turns OFF. The clock signal CLK3 keeps the high potential H and the transistor TR4 is kept OFF. The node N1 is at the high potential H and in a floating state. The clock signal CLK1 changes from the low potential L to the high potential H, so that the transistor TR2 turns OFF.

The transistor TR3 keeps being OFF; the node N2 is at the low potential L and is in a floating state. The clock signal CLK2 changes from the high potential H to the low potential L. Since the node N2 is in a floating state, the potential of the node N2 decreases to a potential (very low potential) LL lower than the low potential L (a bootstrap circuit). The output transistor TR9 keeps being ON. The output signal OUT changes from the high potential H to the low potential L together with the clock signal CLK2. This flip-flop outputs data to be transferred to the signal line of the display region 125 and the next flip-flop for the period from the time T2 to the time T3.

Next, operation of the components at the time T3 is described. The input signal IN keeps the high potential H and the transistor TR5 is kept OFF. The clock signal CLK1 keeps the high potential H and the transistor TR2 is kept OFF.

The clock signal CLK3 changes from the high potential H to the low potential L. The transistor TR4 turns ON. The potential of the node N1 changes from the high potential H to the low potential L. The output transistor TR8 turns ON and the output signal OUT changes from the low potential L to the high potential H. The period from the time T2 to the time T3 is the output period to output data.

In response to the change of the clock signal CLK3, the transistor TR3 turns ON and the potential at the node N2 changes from the very low potential LL to the high potential H. The clock signal CLK2 changes from the low potential L to the high potential H. The output transistor TR9 turns OFF.

Next, operation of the components at the time T4 is described. The input signal IN keeps the high potential H and the transistor TR5 is kept OFF. The clock signal CLK3 changes from the low potential L to the high potential H and the transistor TR4 turns OFF. The node N1 is at the low potential L and in a floating state. The output transistor TR8 and the transistor TR3 keep being ON.

The clock signal CLK1 changes from the high potential H to the low potential L and the transistor TR2 turns ON. The input signal IN keeps the high potential H and the node N2 is kept at the high potential H. The output transistor TR9 keeps being OFF. At the time T1, input of the clock signal CLK1 is necessary to change the potential of the node N2 from the high potential H to the low potential L because the input signal IN is at the low potential L. At this time T4, however, the node N2 is maintained at the high potential H even though the clock signal CLK1 is input and therefore, the operation of the shift register is not affected.

The input signal IN and the clock signal CLK3 keep the high potential H for the period from the time T4 to the time T6. Accordingly, the transistors TR5 and TR4 keep being OFF and the node N1 is in a floating state. The potential of the node N1 at the time T4 is the low potential L.

For this reason, the off-leakage current from either one or both of the transistors TR5 and TR4 could flow into the node N1. The off-leakage current discharges the capacitor of the output transistor TR8 coupled to the node N1, so that the potential of the node N1 increases from the low potential L. Then, the output transistor TR8 may erroneously turn from ON to OFF to change the output signal OUT.

Commonly, the transistors of the shift register in a display device are made of low-temperature polysilicon (LTPS). The off-leakage current of an LTPS transistor is as high as the sub-pico ampere level. If the film quality is not good like in the case where the polysilicon in the channel region has a defect, the off-leakage current increases more. Meanwhile, the off-leakage current increases as the temperature rises, which may cause a shift register in a high-temperature environment to operate unstably.

Figure 5:
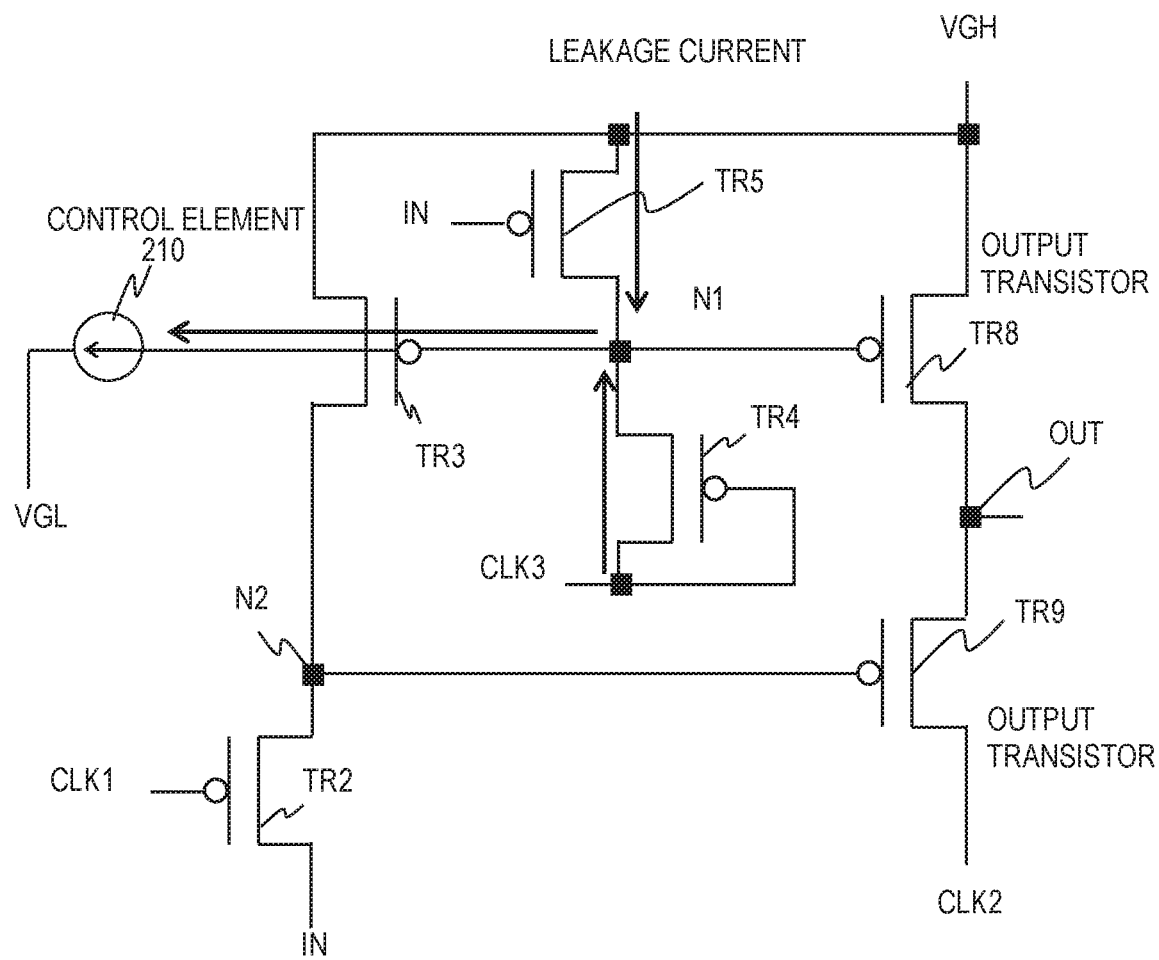
FIG. 5 illustrates a configuration example of a circuit in Embodiment 1.

FIG. 5 illustrates a configuration example of a circuit in this embodiment. The circuit in this embodiment includes a control element 210 in addition to the components of the flip-flop of the comparative example illustrated in FIG. 3 to diminish the change of the charge at the gate of the transistor TR8 caused by off-leakage current.

The control element 210 operates to make electric current flow between the node N1 (the gate of the transistor TR8) and a low-potential power supply (power line) for supplying a low power-supply potential VGL in the opposite direction of the off-leakage current with respect to the node N1 (the gate of the transistor TR8). The low power-supply potential VGL is a potential equal to or lower than the low potential L of the clock signals. The control element 210 controls the current flowing between the node N1 (the gate of the transistor TR8) and the low-potential power supply to diminish the change of the charge retained at the gate of the transistor TR8 caused by off-leakage current. The control element 210 can be included in the scanning driver 131, the element measurement circuit 132, or the driver IC 134.

Figure 6:
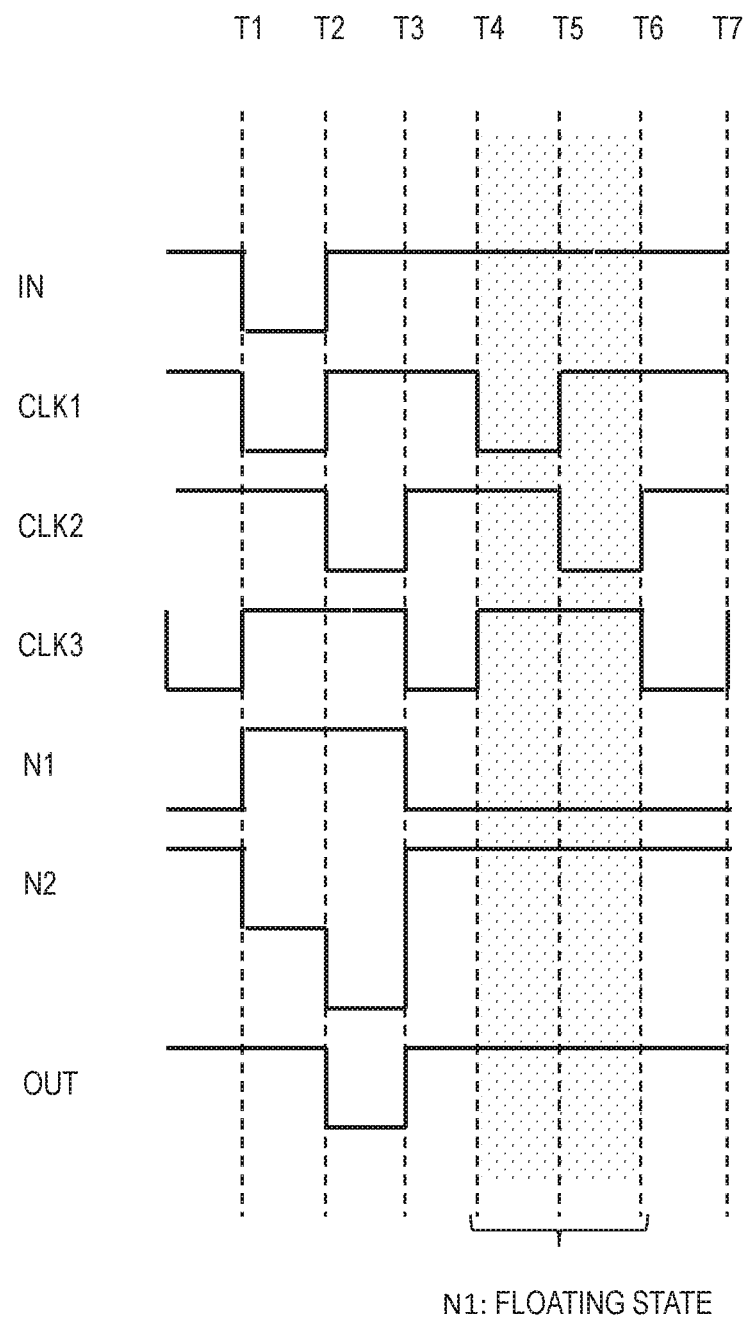
FIG. 6 is a timing chart of the circuit in Embodiment 1.

FIG. 6 is a timing chart of the circuit in this embodiment. The operation of the components other than the control element 210 is the same as the operation in the comparative example described with reference to FIGS. 3 and 4. As described above, the control element 210 diminishes the change of the charge at the gate of the transistor TR8 caused by off-leakage current. As a result, the predetermined floating potential can be maintained for a longer time to decrease the probability of erroneous operation of the output transistor TR8 and the shift register.

Figure 7:
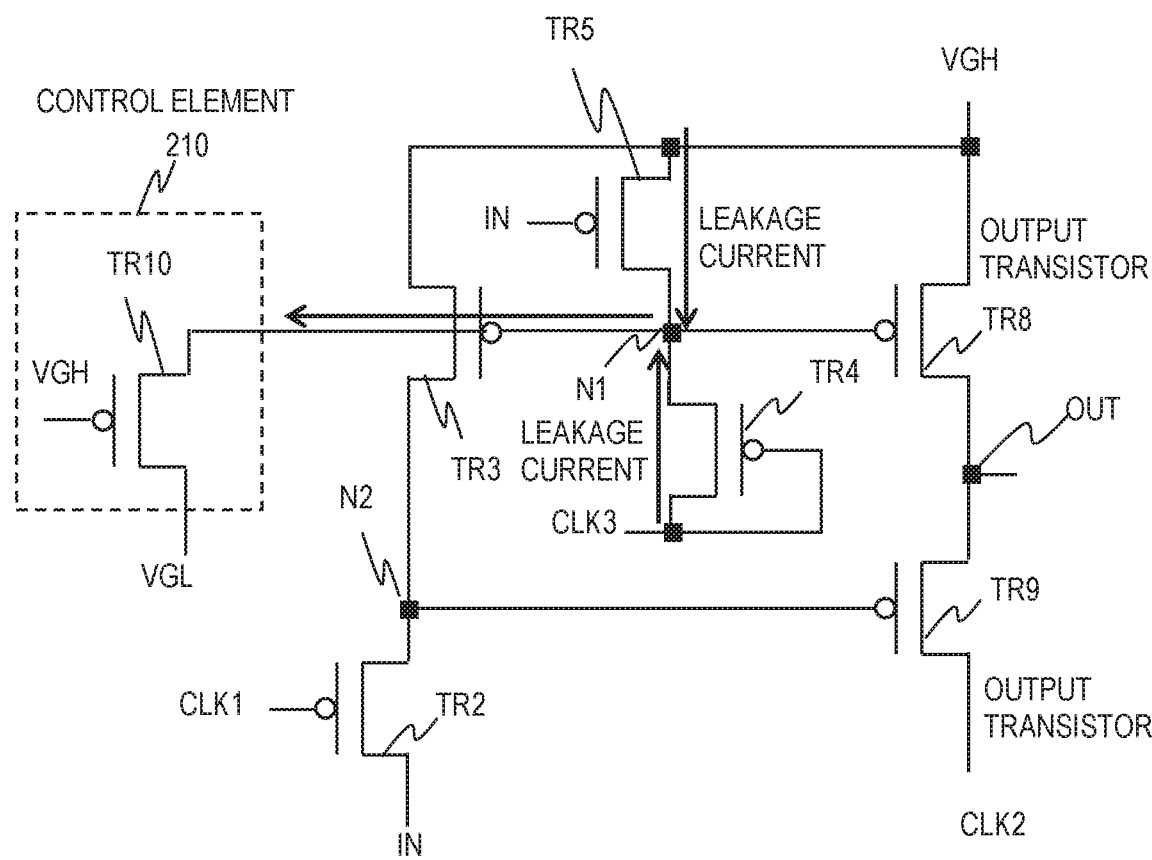
FIG. 7 illustrates a configuration of a circuit in which a control element is a transistor.

FIG. 7 illustrates a configuration of a circuit in which the control element 210 is a transistor TR10 (an example of a third field-effect transistor). In this example, the transistor TR10 is a p-channel TFT, like the other transistors. Accordingly, all transistors in this circuit have the same type of conductivity. The source of the transistor TR10 is connected with the node N1 and the drain of the transistor TR10 is connected with the low-potential power supply. The gate of the transistor TR10 is supplied with the high power-supply potential VGH.

The drain of the transistor TR10 is supplied with the low power-supply potential VGL and the source is supplied with the same potential as the node N1. The low power-supply potential VGL is a potential equal to or lower than the low potential L of the clock signals. The potential at the node N1 changes between the low potential L and the high potential H of the clock signals. Accordingly, the transistor TR10 is OFF all the time.

At the time T4 when the node N1 (the gate of the output transistor TR8) starts floating, the node N1 is at the low potential L. When the potential of the node N1 increases because of off-leakage current from the transistor TR4 and/or the transistor TR5, the off-leakage current flows into the transistor TR10. The current flowing to the gate of the output transistor TR8 decreases so that the capacitor coupled to the gate can retain the charge.

As described above, the transistor TR5 (an example of the first field-effect transistor) is ON to supply the high potential to the gate of the output transistor TR8 for a first period from the time T1 to the time T2. The transistor TR5 is OFF for a second period (from the time T2 to the time T7) subsequent to the first period. The first period and the second period are repeated alternately. The transistor TR4 (an example of the second field-effect transistor) is ON for a third period shorter than the second period twice (from the time T3 to the time T4 and from the time T6 to the time T7) to supply the low potential to the gate of the output transistor TR8. The transistor TR10 (an example of the third field-effect transistor) operates to make electric current flow to the low-potential power supply in the first period and the second period.

As illustrated in FIG. 6, the node N1 is at the high potential H for the period from the time T1 to the time T3. The voltage applied to the transistor TR10 is higher than the voltage applied in the other periods. However, the drain current Ids of the transistor TR10 is substantially constant in relation to the drain voltage Vds (saturation characteristics). Accordingly, if the voltage between the drain and the source of the transistor TR10 increases, the current is constant and does not increase, so that the power consumption is prevented from increasing.

As described above, the off-leakage current of the transistors TR4 and TR5 could increase as the temperature rises. In this example, the control element 210 is the transistor TR10. The off-leakage current of the transistor TR10 varies with temperature like the off-leakage current of the transistors TR4 and TR5. In other words, the effect of the increase (variation) in off-leakage current is balanced out. Accordingly, the erroneous operation of the shift register because of increase in temperature is effectively prevented.

As described above, the transistor TR10 prevents change of the charge stored at the gate of the output transistor TR8 by directing the current flowing from the transistor TR4 and/or the transistor TR5 to the node N1 toward the low-potential power supply. In an example, the conductivity of the transistor TR10 is equal to or higher than the sum of the conductivity of the transistor TR4 and the transistor TR5.

This configuration more effectively directs the current flowing from the transistor TR4 and/or the transistor TR5 to the node N1 to the low-potential power supply. The total sum of the leakage current flowing from the high-potential power supply to the node N1 through the transistors TR4 and TR5 is balanced out by the current flowing from the node N1 to the low-potential power supply through the transistor TR10, so that the current flowing into the gate of the output transistor TR8 decreases close to zero; the charge retention ability at the gate of the output transistor TR8 increases.

Figure 8:
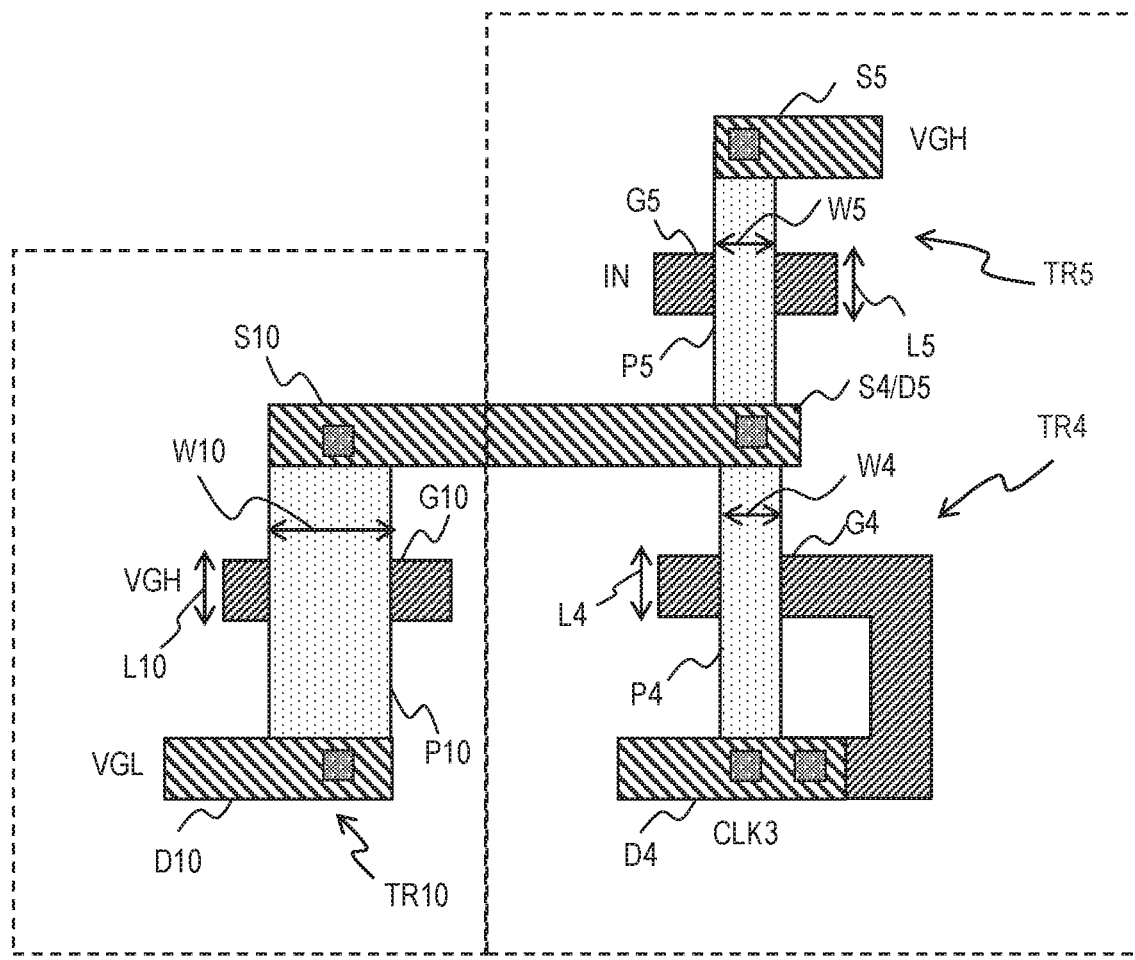
FIG. 8 illustrates an example of a pattern of transistors that satisfies a predetermined relation of conductivity.

FIG. 8 illustrates an example of a pattern of the transistors TR4, TR5, and TR10 that satisfies the above-described relation of conductivity. The drain electrode D4 of the transistor TR4 is connected with the gate electrode G4 and supplied with the clock signal CLK3. The source electrode S4 is connected with the drain electrode D5 of the transistor TR5.

Although FIG. 8 illustrates bottom-gate transistors such that the gate electrode is located lower than the polysilicon film (active layer) by way of example, the transistors can be top-gate transistors such that the gate electrode is located upper than the active layer.

The source electrode S5 of the transistor TR5 is supplied with the high power-supply potential VGH. The gate electrode G5 of the transistor TR5 is supplied with the input signal IN. The source electrode S10 of the transistor TR10 is connected with the source electrode S4 of the transistor TR4 and the drain electrode D5 of the transistor TR5. The drain electrode D10 of the transistor TR10 is supplied with the low power-supply potential VGL. The gate electrode G10 of the transistor TR10 is supplied with the high power-supply potential VGH.

The transistor TR4 has a channel length L4 and a channel width W4. The channel length L4 and the channel width W4 are determined by the overlap area of the gate electrode G4 and the polysilicon film P4. The transistor TR5 has a channel length L5 and a channel width W5. The channel length L5 and the channel width W5 are determined by the overlap area of the gate electrode G5 and the polysilicon film P5.

The transistor TR10 has a channel length L10 and a channel width W10. The channel length L10 and the channel width W10 are determined by the overlap area of the gate electrode G10 and the polysilicon film P10. The conductivity of a transistor can be expressed as the channel width/the channel length. Accordingly, $W10/L10 \geq W4/L4 + W5/L5$ is satisfied.

Figure 9:
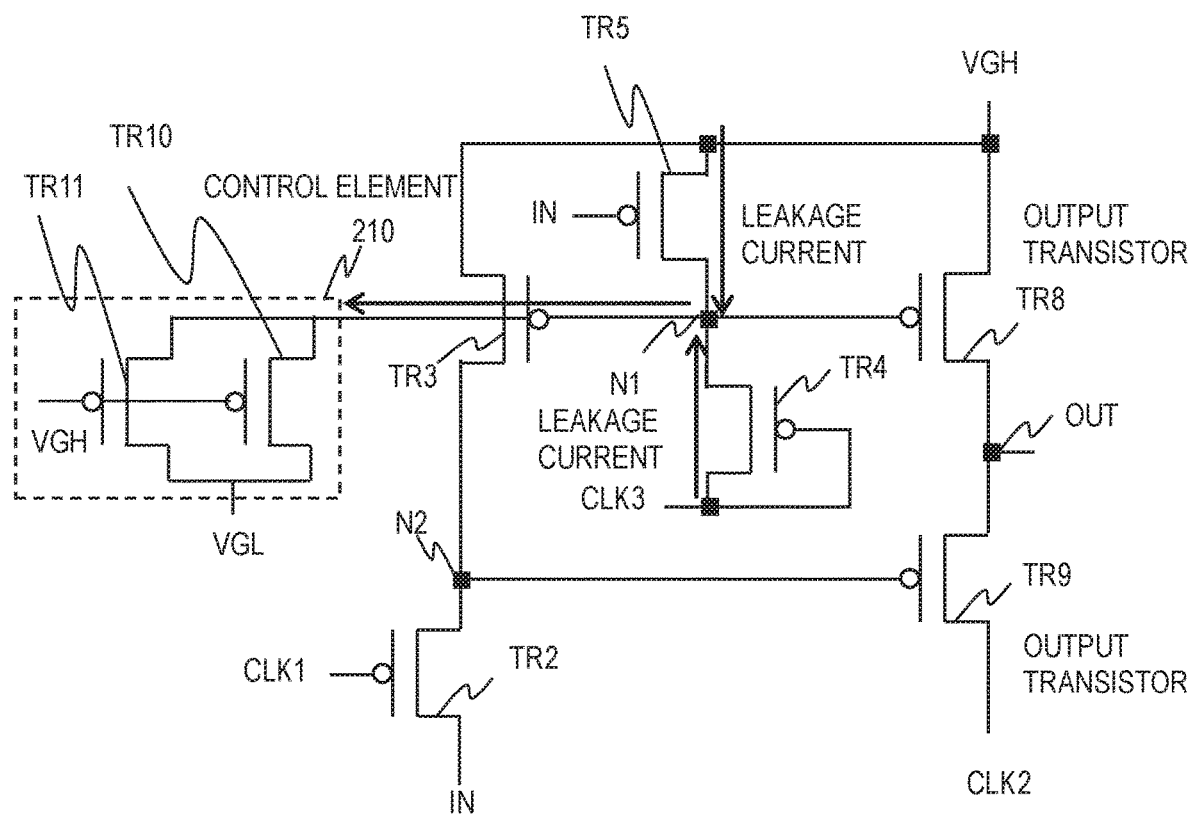
FIG. 9 illustrates another configuration example of a control element in Embodiment 1.

FIG. 9 illustrates another configuration example of the control element 210. The control element 210 can be composed of a plurality of transistors connected in parallel. In the example of FIG. 9, the control element 210 is composed of two transistors TR10 and TR11 connected in parallel and provided between the node N1 and the low-potential power supply. The conductivity of the control element 210 can be increased by increasing the number of transistors.

Figure 10:
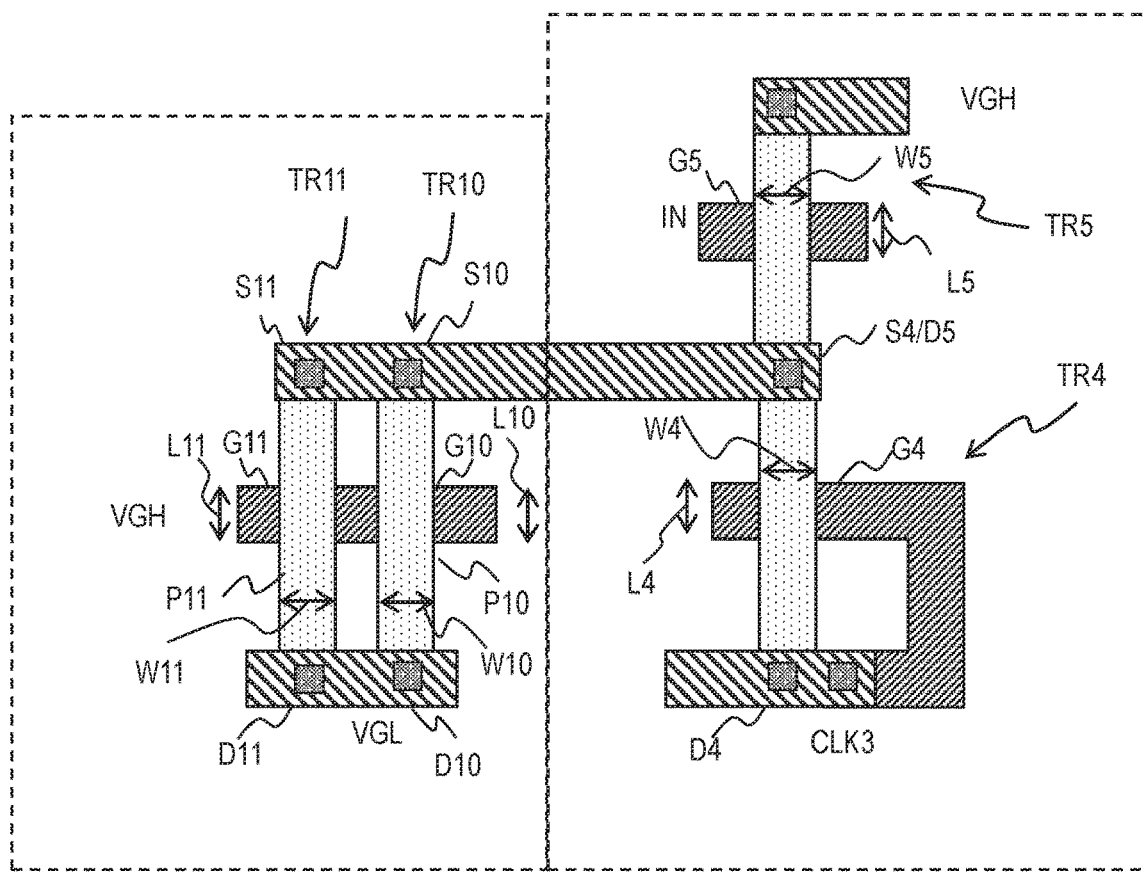
FIG. 10 illustrates another example of a pattern of transistors that satisfies a predetermined relation of conductivity.

In an example, the sum of the conductivity of the transistor TR10 and the transistor TR11 is equal to or higher than the sum of the conductivity of the transistor TR4 and the transistor TR5. FIG. 10 illustrates an example of a pattern of the transistors TR4, TR5, TR10, and TR11 that satisfies this relation of conductivity. Differences from the configuration example in FIG. 8 are mainly described in the following.

The gate electrode G11, the source electrode S11, and the drain electrode D11 of the transistor TR11 (another example of the third field-effect transistor) are respectively connected with the gate electrode G10, the source electrode S10, and the drain electrode D10 of the transistor TR10. The transistor TR11 has a channel length L11 and a channel width W11. The channel length L11 and the channel width W11 are determined by the overlap area of the gate electrode G11 and the polysilicon film P11. Accordingly, W10/L10+W11/L11≥W4/L4+W5/L5 is satisfied.

Figure 11:
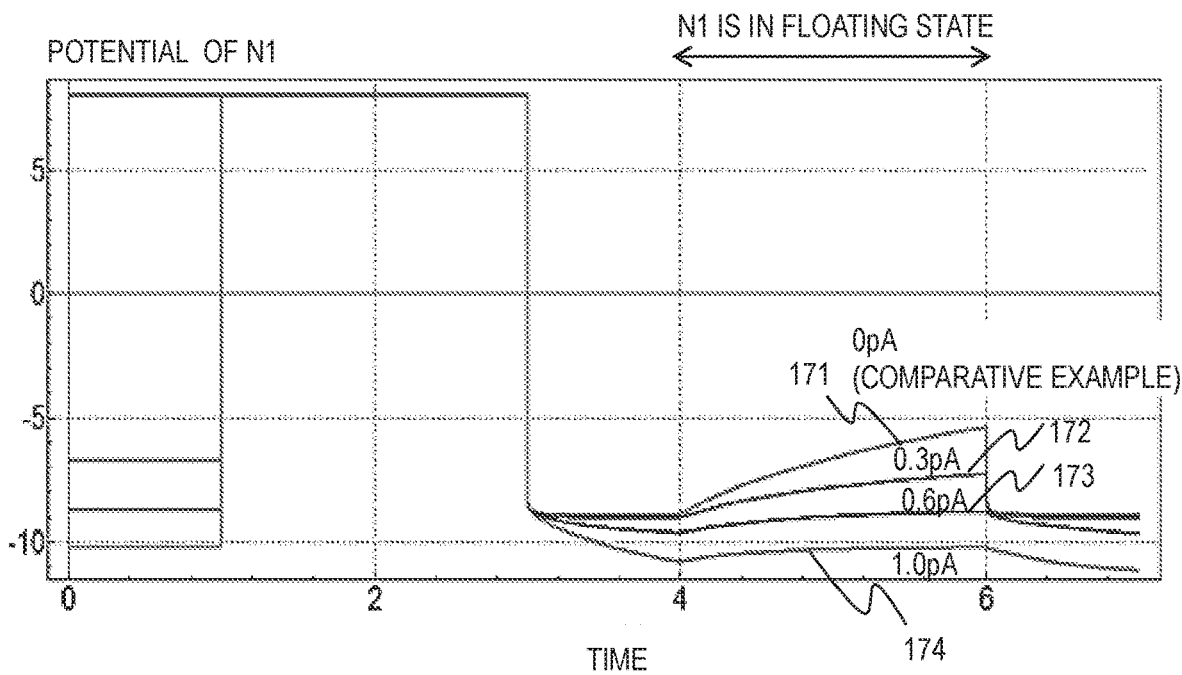
FIG. 11 provides results of simulation of a circuit including a control element and a flip-flop.

FIG. 11 provides results of simulation of a circuit including a control element 210 and a flip-flop. In the graph of FIG. 11, the vertical axis represents the potential of the node N1 and the horizontal axis represents time. The lines 171 to 174 represent the potential of the node N1 in the cases where the control element 210 passes different currents in the period from the time T4 to the time T6 where the node N1 is in a floating state.

The lines 171 to 174 represent the potential of the node N1 when the currents passed by the control element 210 is 0 pA, 0.3 pA, 0.6 pA, and 1.0 pA. The current of 0 pA corresponds to a comparative example where the control element 210 does not exist. As understood from the graph of FIG. 11, the control element 210 passing current diminishes the increase of the potential at the node N1 in a floating state.

Although the control elements 210 in the foregoing examples are composed of one or more transistors, a control element 210 can be composed of a different circuit element, for example a resistive element like a polysilicon film. It is preferable that the resistive element have a resistance that balances out the leakage current of the transistors. As described above, all transistors having the same type of conductivity facilitate manufacturing the transistors on a substrate.

Embodiment 2

Hereinafter, configuration examples of circuits in Embodiment 2 including a flip-flop and a control element are described. The circuits in this embodiment reduce the probability of erroneous operation of the flip-flop in the period where the circuit outputs data (when the output signal OUT is at the low potential L). As a result, the shift register attains stable operation in the period where the control line is selected, allowing for a longer selection period.

Figure 12:
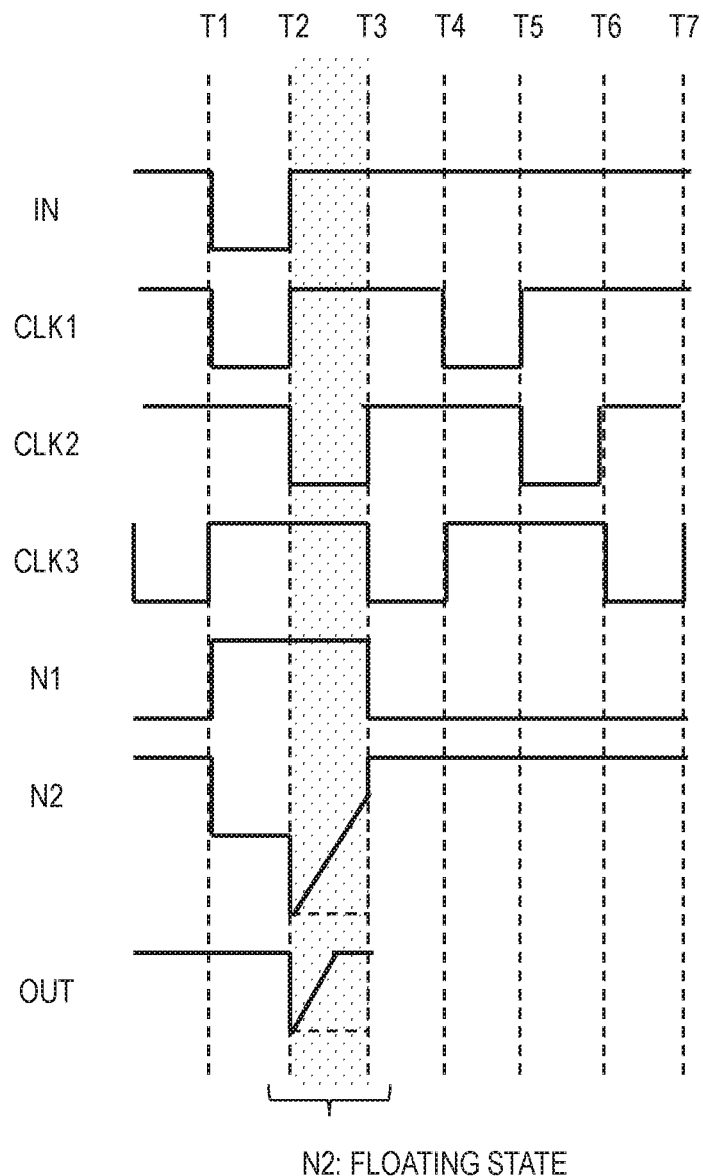
FIG. 12 illustrates change of the output signal that could occur in the circuit configuration of the comparative example illustrated in FIG. 3 and change of the potential of a node that causes the change of the output signal.

FIG. 12 illustrates change of the output signal OUT that could occur in the circuit configuration of the comparative example illustrated in FIG. 3 and change of the potential of the node N2 that causes the change of the output signal OUT. The node N2 is in a floating state for the period (output period) from the time T2 to the time T3. The potential of the node N2 at the time T2 is the very low potential LL. The source of the transistor TR3 (an example of the first field-effect transistor) being OFF is at the high potential H (the high power-supply potential VGH). The source of the transistor TR2 (an example of the second field-effect transistor) being OFF is at the potential of the input signal IN, which is the high potential H.

Accordingly, off-leakage current could flow from the transistors TR3 and TR2. As described in Embodiment 1, the off-leakage current discharges the capacitor of the output transistor TR9 coupled to the node N2, so that the potential of the node N2 increases from the very low potential LL. Then, the output transistor TR9 may erroneously turn from ON to OFF to change the output signal OUT.

Figure 13:
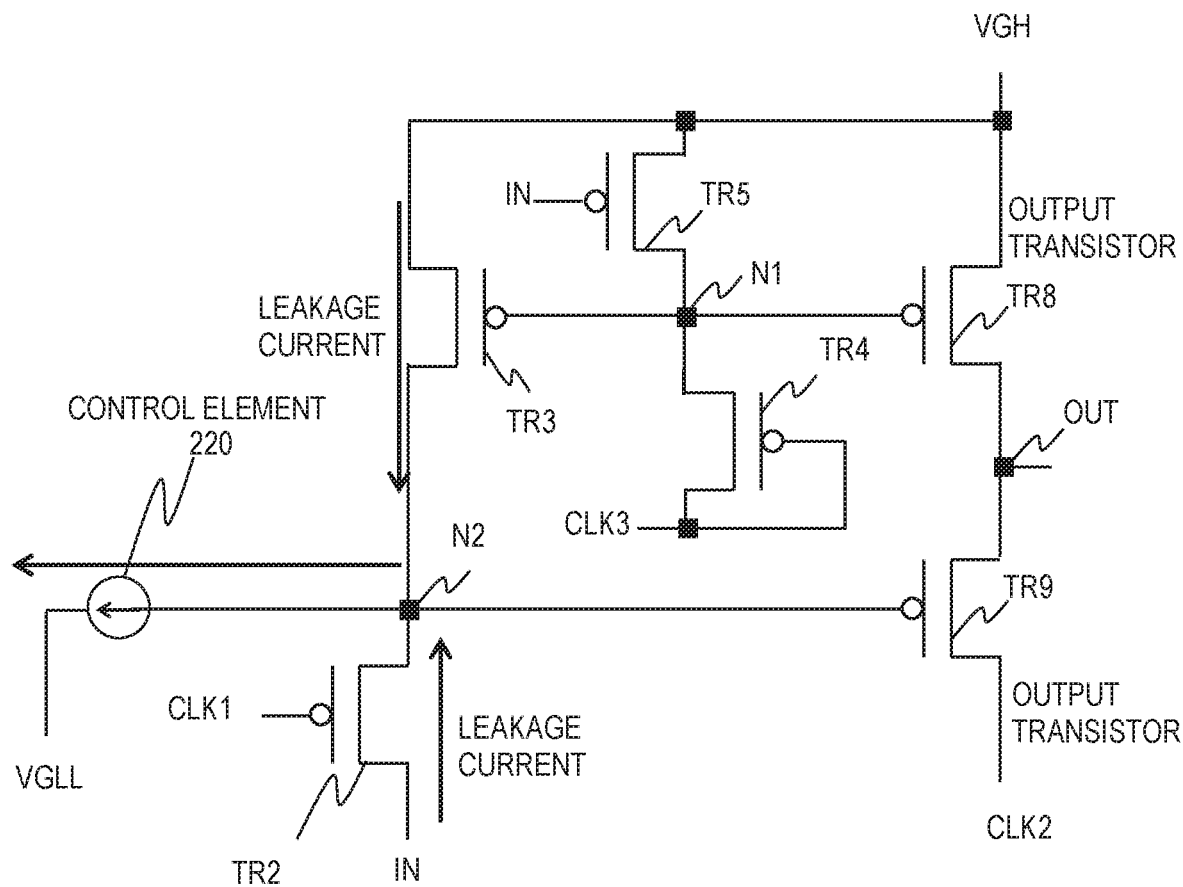
FIG. 13 illustrates a configuration example of a circuit in Embodiment 2 including a control element and a flip-flop.

FIG. 13 illustrates a configuration example of a circuit in this embodiment including a control element 220 and a flip-flop. The control element 220 directs off-leakage current flowing into the node N2 to a low-potential power supply to diminish the change of the charge retained at the gate of the transistor TR9. The operation of the control element 220 are substantially the same as the operation of the control element 210 in Embodiment 1.

Figure 14:
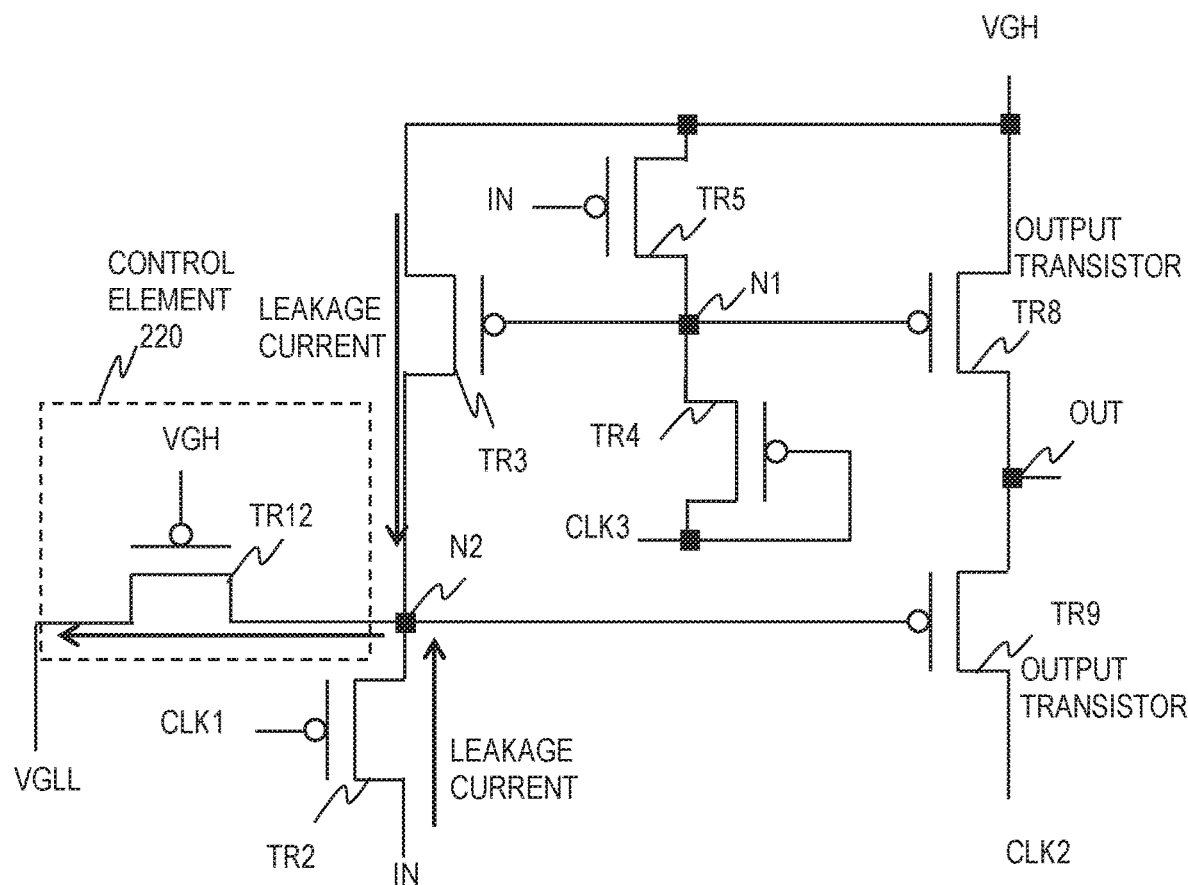
FIG. 14 illustrates a configuration of a circuit in Embodiment 2 in which the control element is a transistor.

FIG. 14 illustrates a configuration of a circuit in which the control element 220 is a transistor TR12 (an example of a third field-effect transistor). In this example, the transistor TR12 is a p-channel TFT, like the other transistors. Accordingly, all transistors in this circuit have the same type of conductivity. The source of the transistor TR12 is connected with the node N2 and the drain of the transistor TR12 is connected with a very-low-potential power supply for supplying a very low power-supply potential VGLL equal to or lower than the very low potential LL. The gate of the transistor TR12 is supplied with the high power-supply potential VGH.

The transistor TR12 is controlled to be OFF all the time, like the transistor TR10 in Embodiment 1. Making the off-leakage current flow through the transistor TR12 prevents the current flowing from the transistors TR2 and TR3 into the node N2 from changing the amount of charge retained at the gate of the output transistor TR9.

As described above, the transistor TR3 (an example of the first field-effect transistor) is OFF for the period (the fourth period) from the time T1 to the time T3 and is ON for the subsequent period (the fifth period) from the time T3 to the time T7 to supply the high potential to the gate of the output transistor TR9. The fourth period and the fifth period are repeated alternately.

The transistor TR2 (an example of the second field-effect transistor) is ON for the sixth period (from the time T1 to the time T2) included in the fourth period but shorter than the fourth period and for a period (from the time T4 to the time T5) included in the fifth period but shorter than the fifth period to supply the low potential to the gate of the output transistor TR9. The transistor TR12 (an example of the third field-effect transistor) operates to make current flow to the very-low current supply in the fourth period and the fifth period.

As described above, the potential of the node N2 falls to the very low potential LL that is lower than the low potential L of the clock signals in the period from the time T2 to the time T3 where the node N2 is in a floating state. During this period, a high voltage is applied across the sources and the drains of the transistors TR2 and TR3 and therefore, the off-leakage current is high.

Such a high voltage will shorten the lives of the transistors TR2 and TR3. Further, a power supply for supplying a power-supply potential equal to or lower than the very-low potential LL has to be prepared for the control element 220 to make current flow from the node N2 to the power supply.

Figure 15:
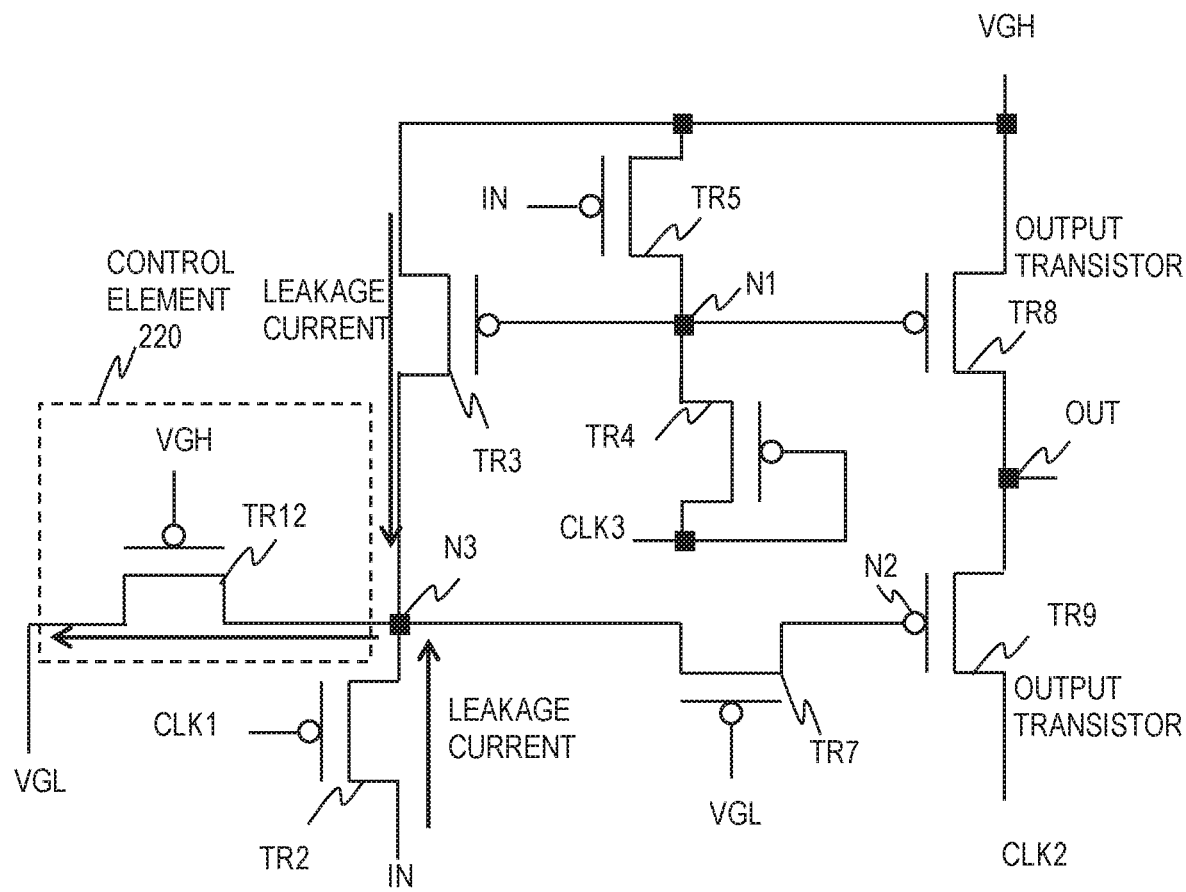
FIG. 15 illustrates a configuration example of another circuit in Embodiment 2.

FIG. 15 illustrates a configuration example of another circuit in this embodiment. The circuit configuration in FIG. 15 includes a limiter transistor TR7 (an example of a limiter field-effect transistor), in addition to the circuit configuration in FIG. 14. In the following, differences from the configuration example in FIG. 14 are mainly described. The limiter transistor TR7 is provided between the gate of the output transistor TR9 and a node N3 between the drain of the transistor TR3 and the source of the transistor TR2. The gate of the limiter transistor TR7 is supplied with the low power-supply potential VGL. The low power-supply potential VGL in this example is equal to the low potential L of the clock signals.

The limiter transistor TR7 is OFF for the period (output period) from the time T2 to the time T3 and is ON for the other periods. During the other periods, the node N3 is supplied with the high potential or the low potential from the transistor TR3 or TR2.

In FIG. 15, the gate of the output transistor TR9 and one of the source and the drain of the limiter transistor TR7 are connected with a node N2. The drain of the transistor TR3, the source of the transistor TR2, the source of the transistor TR12, and the remaining source or drain of the limiter transistor TR7 are connected with the node N3.

Figure 16:
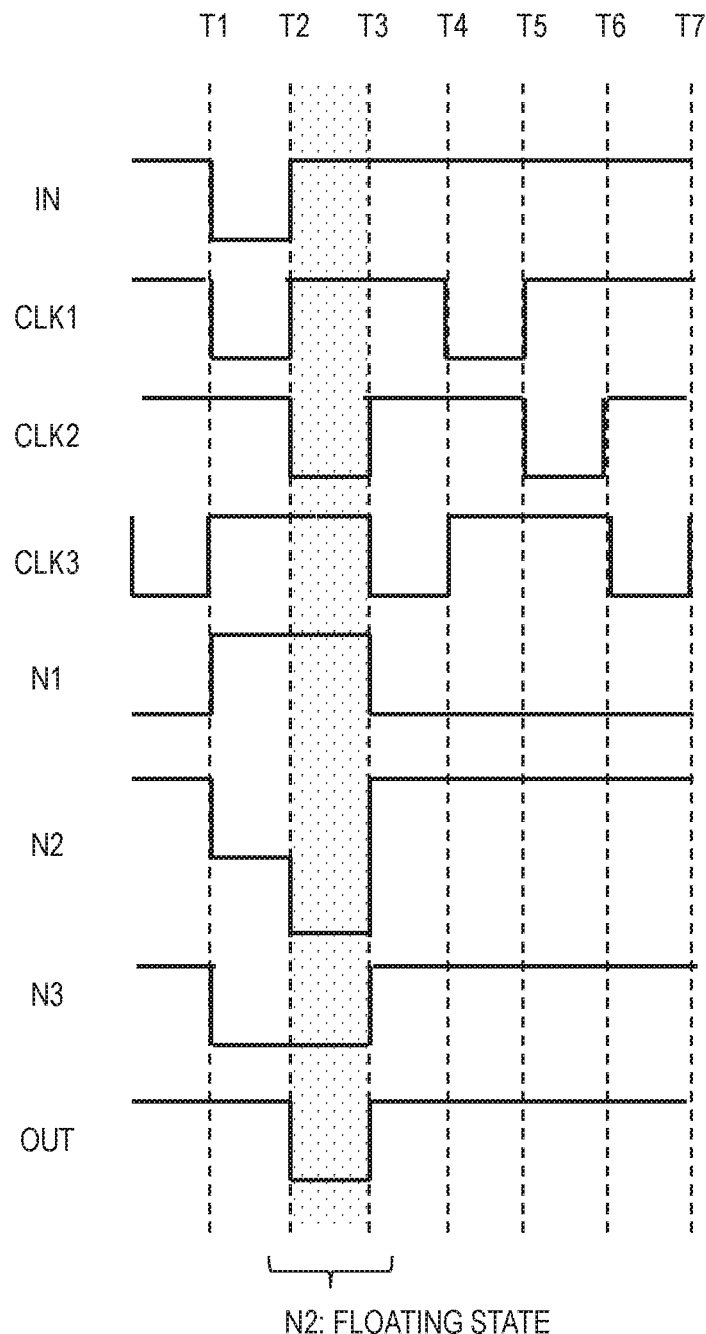
FIG. 16 is a timing chart of the circuit illustrated in FIG. 15.

FIG. 16 is a timing chart of the circuit illustrated in FIG. 15. Compared to the timing chart of FIG. 6 or 12 of a circuit without the limiter transistor TR7, the node N3 is added. The changes of the potentials of the other points are the same as those in FIG. 6 or 12. The node N3 is at the low potential L for the period from the time T1 to the time T3 and at the high potential H for the remaining period.

At the time T2, the potential of the node N2 (the gate of the output transistor TR9) falls to the very low potential LL. Since the gate of the limiter transistor TR7 is supplied with the low potential L (low power-supply potential VGL), the limiter transistor TR7 is OFF. Accordingly, the node N3 is kept at the low potential L.

As described above, the potential of the node N3 could increase in the period from the time T2 to the time T3 because of the off-leakage current from the transistor TR2 or TR3. Unless the transistor TR12 for controlling the current was not provided, the limiter transistor TR7 would turn ON to change the charge (potential) at the gate of the output transistor TR9. The transistor TR12 directs the off-leakage current (at least a part thereof) flowing into the node N3 to the very-low potential power supply to reduce the probability of erroneous operation of the output transistor TR9.

The voltage to be applied across the sources and the drains of the transistors TR2 and the TR3 is VGH–VGL, which is lower than VGH–VGLL in the configuration in FIG. 14. Accordingly, the off-leakage current from the transistors TR2 and TR3 decreases to reduce the change of the potential at the node N3. The transistors TR2 and TR3 can have longer lives and further, the very-low potential power supply for supplying the very-low power-supply potential VGLL becomes unnecessary.

The control element 220 can include a plurality of transistors connected in parallel, like in the example of FIG. 9. The description provided in Embodiment 1 with reference to FIG. 8 or 10 is applicable to this embodiment.

Embodiment 3

Figure 17:
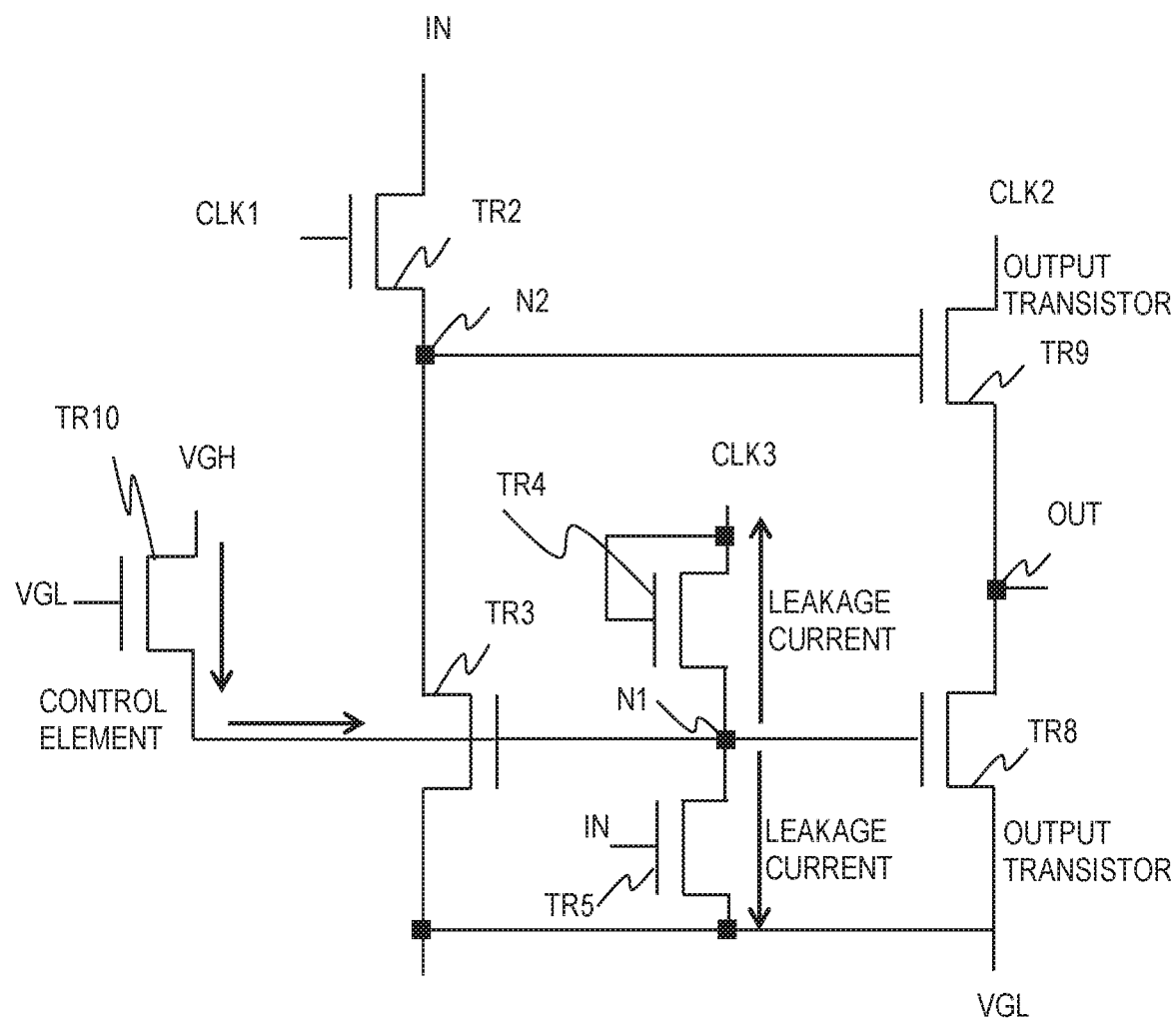
FIG. 17 illustrates a configuration example of a circuit in Embodiment 3.

Hereinafter, a configuration example of a circuit in Embodiment 3 including a flip-flop and a control element is described. The circuit in this embodiment includes n-channel TFTs. FIG. 17 illustrates a configuration example of the circuit in this embodiment corresponding to the circuit configuration in Embodiment 1 in FIG. 7. This circuit configuration is obtained by replacing the p-channel transistors in the circuit configuration in FIG. 7 with n-channel transistors. In FIGS. 7 and 17, the transistors different only in channel type are denoted by the same reference signs.

In the following, differences from Embodiment 1 are mainly described. The inputs to the flip-flop are a low power-supply potential (low potential) VGL, an input signal IN from the previous flip-flop, and clock signals CLK1, CLK2, and CLK3. The input signal IN and the clock signals CLK1, CLK2, and CLK3 are changed between a high potential H and a low potential L equal to the low power-supply potential VGL.

The source of the output transistor TR8 is connected with a power line for supplying the low power-supply potential VGL. When the output transistor TR8 is ON, the node OUT outputs the low potential L; when the output transistor TR9 is ON, the node OUT outputs the clock signal CLK2. When the output transistor TR9 is ON, the clock signal CLK2 is at the high potential H.

The transistor TR5 (an example of the first field-effect transistor) is connected between the power line for supplying the low power-supply potential VGL and the gate of the output transistor TR8. The transistor TR5 turns ON/OFF in accordance with the input signal IN; when the transistor TR5 is ON, the transistor TR5 supplies the low power-supply potential VGL (low potential L) to the gate of the output transistor TR8 to turn the output transistor TR8 OFF.

The transistor TR4 (an example of the second field-effect transistor) supplies the clock signal CLK3 at the high potential H to the gate of the output transistor TR8 (the node N1) to turn the output transistor TR8 ON. When the clock signal CLK3 is at the low potential L, the transistor TR4 is OFF; when the clock signal CLK3 is at the high potential H, the transistor TR4 is ON.

The transistor TR3 is connected between the power line for supplying the low power-supply potential VGL (low potential L) and the gate of the output transistor TR9. The transistor TR3 turns ON/OFF together with the output transistor TR8. When the transistor TR3 is ON, the transistor TR3 supplies the low potential L to the gate of the output transistor TR9 to turn the output transistor TR9 OFF.

The transistor TR2 turns ON/OFF in accordance with the clock signal CLK1. When the transistor TR2 is ON, the transistor TR2 supplies the input signal IN to the gate of the output transistor TR9. The transistor TR2 supplies data (high potential) in the input signal IN transferred from the previous flip-flop to the output transistor TR9 for the period where the transistor TR2 is ON.

Figure 18:
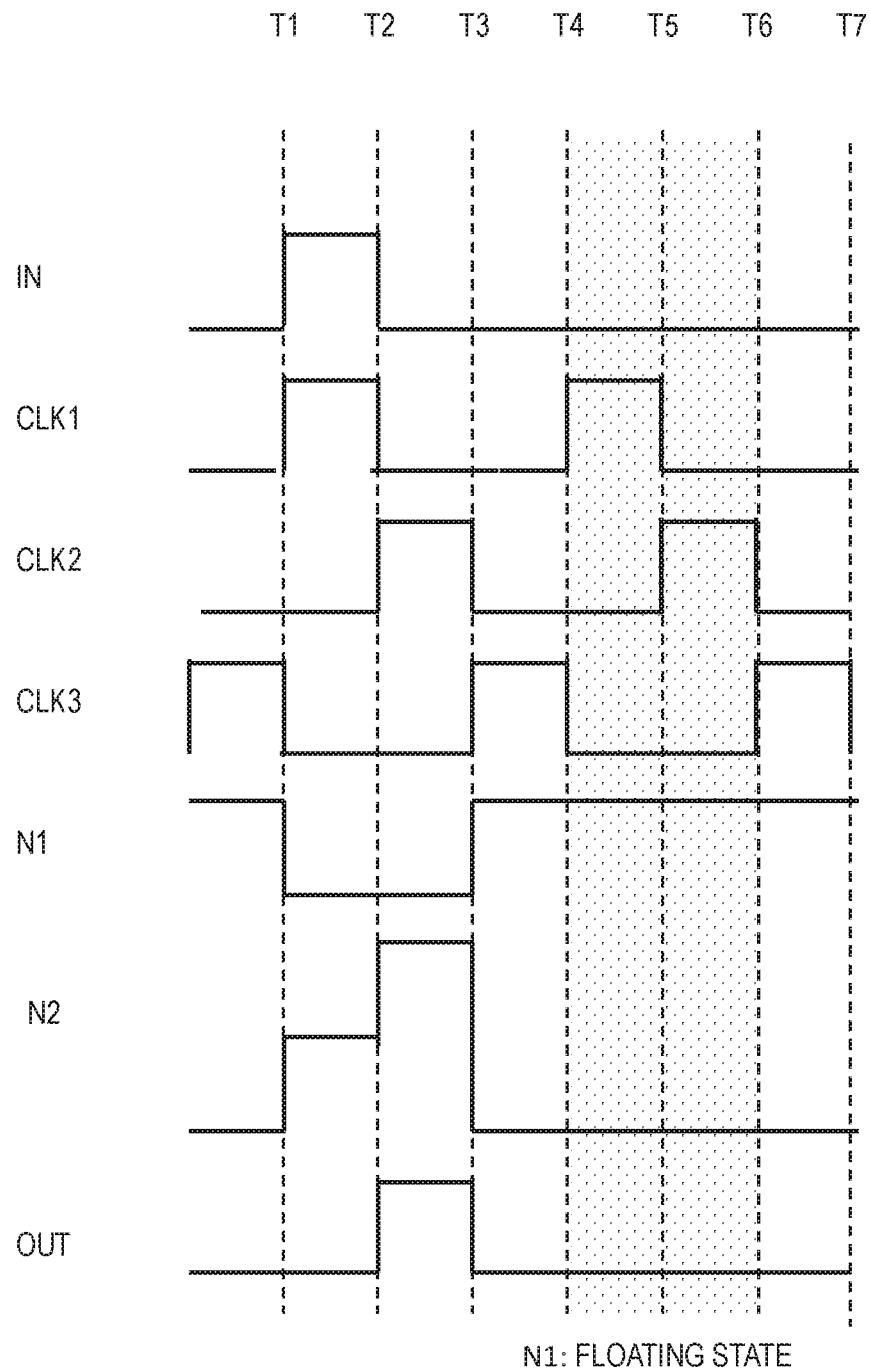
FIG. 18 is a timing chart of the circuit illustrated in FIG. 17.

FIG. 18 is a timing chart of the circuit illustrated in FIG. 17. Compared to the timing chart of FIG. 6, the high potential H and the low potential L at each point are opposite. The remaining is the same; the node N1 is in a floating state for the period from the time T4 to the time T6.

Returning to FIG. 17, the off-leakage currents at the transistors TR4 and TR5 flow in the opposite directions of the off-leakage currents in the circuit configuration in Embodiment 1 illustrated in FIG. 7 and flow away from the node N1. To diminish the change of the charge (potential) at the gate of the output transistor TR8 caused by the off-leakage current, the transistor TR10 (an example of the third field-effect transistor) as a current control element supplies current from the power supply to the node N1.

As illustrated in FIG. 17, the drain of the transistor TR10 is connected with a power supply (power line) supplying a high power-supply potential VGH. The high power-supply potential VGH is equal to or higher than the high potential H of the clock signals. The gate of the transistor TR10 is supplied with the low power-supply potential VGL (low potential L) and the transistor TR10 is OFF. When the potential of the node N1 decreases from the high potential H because of the off-leakage current from the transistor TR4 and/or the transistor TR5, the off-leakage current from the transistor TR10 flows into the node N1. This off-leakage current from the transistor TR10 diminishes the change of the charge retained at the gate of the output transistor TR8.

The other features described in Embodiment 1 are applicable to circuits including n-channel transistors. The circuits described in Embodiment 2 can include n-channel transistors. Compared to the circuits in Embodiment 2 including p-channel transistors, the high potential and the low potential to be supplied are opposite. The same applies to the other embodiments.

Embodiment 4

A circuit in Embodiment 4 including a flip-flop and a control element is described. An example of the flip-flop in this embodiment has the same circuit configuration as the one illustrated in FIG. 5. The control element in this embodiment is a current supply circuit. As illustrated in FIG. 5, the control element 210 of a current supply circuit is connected with the node N1 in the flip-flop. The current supply circuit can be incorporated in the driver IC 134, for example, and include a field-effect transistor (MOSFET).

Figure 19:
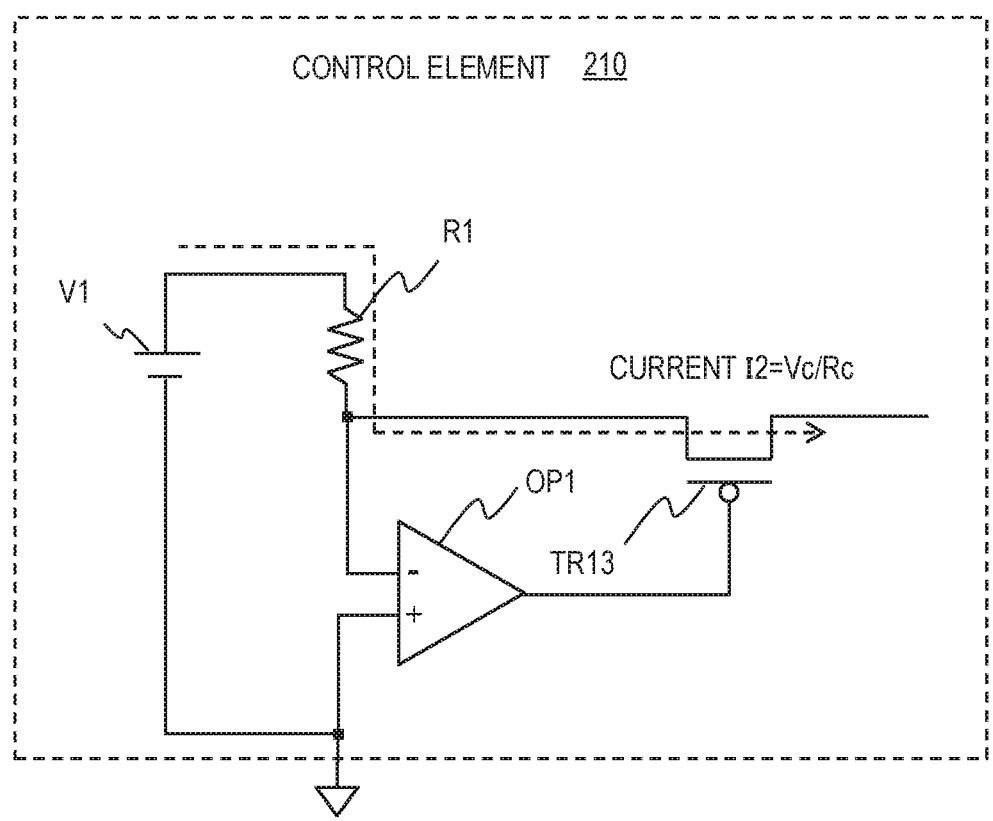
FIG. 19 illustrates a configuration example of a current supply circuit of a control element in Embodiment 4.

FIG. 19 illustrates a configuration example of a current supply circuit of a control element 210 in this embodiment. The non-inverting amplifier terminal (+) of an operational amplifier OP1 is connected with the ground. The inverting amplifier terminal (−) also has the ground potential because of virtual grounding (virtual short circuit). A direct voltage V1 is applied to the resistor R1, so that a current I2=(the value of the direct voltage V1)/(the resistance of the resistor R1) flows through the resistor R1.

The inverting amplifier terminal (−) of the operational amplifier OP1 is connected with the resistor R1 and the source/drain of a transistor TR13. The output terminal of the operational amplifier OP1 is connected with the gate of the transistor TR13. No current flows between the inverting amplifier terminal (−) and the non-inverting amplifier terminal (+) and therefore, all current flowing through the resistor R1 flows between the source and the drain of the transistor TR13.

The gate voltage of the transistor TR13 is automatically adjusted to maintain the current I2 calculated from the value of the direct voltage V1 and the resistance of the resistor R1. In other words, the amount of the current I2 can be determined desirably by the value of the direct voltage V1 and the resistance of the resistor R1.

Figure 20:
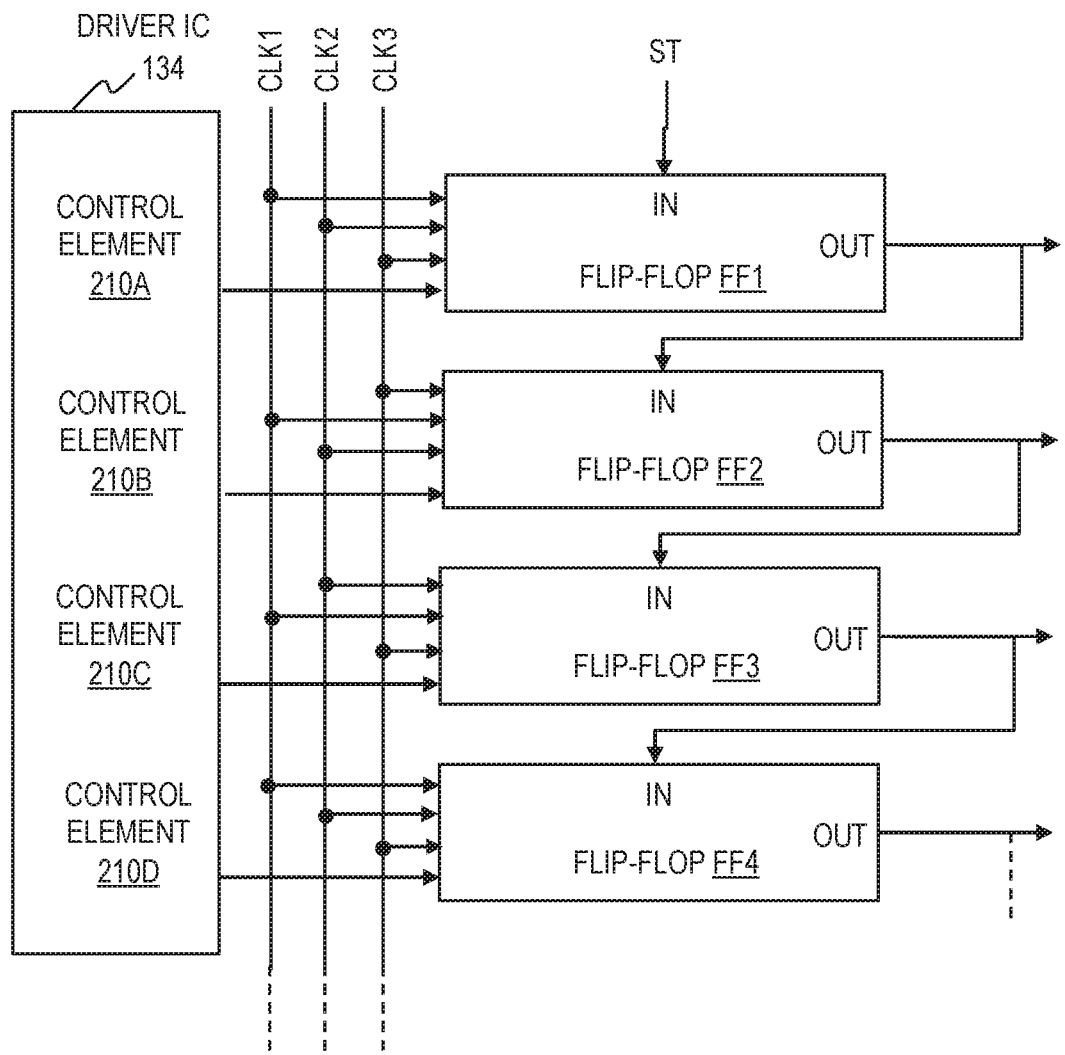
FIG. 20 illustrates four stages of flip-flops in a shift register and control elements therefor in Embodiment 4.
Figure 21:
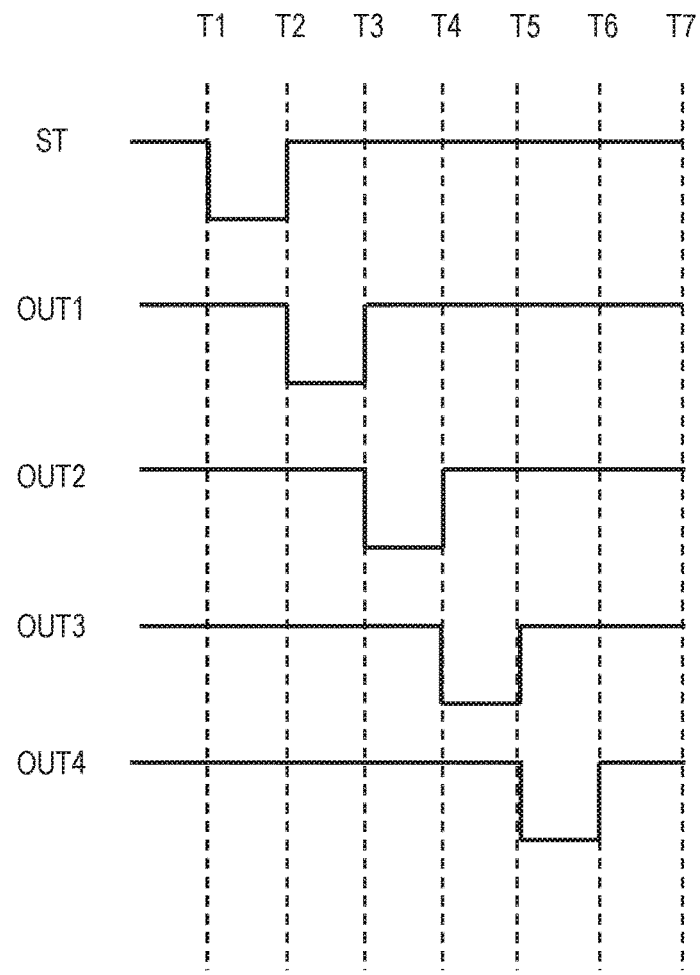
FIG. 21 is a timing chart of the signals of the flip-flops in FIG. 20.

FIG. 20 illustrates four stages of flip-flops in a shift register and control elements therefor in this embodiment. The driver IC 134 includes control elements 210A to 210D. Each of the control elements 210A to 210D is the current supply circuit illustrated in FIG. 19. FIG. 21 is a timing chart of the signals of the flip-flops FF1 to FF4.

A start pulse ST is input to the first flip-flop FF1 and the signal is transferred to the next stage. The signal is shifted by one horizontal period repeatedly and output to OUT1 to OUT4 one after another. Each flip-flop (each stage of the shift register) is connected with one of the control elements 210A to 210D in the driver IC 134 to receive electric current individually.

Each current supply circuit is adjusted to supply an amount of current (the second current I2) in accordance with the amount of leakage current from the transistors in the flip-flop (see FIG. 5), so that the leakage current can be canceled out precisely. That is to say, high-quality panels equipped with a panel-specific shift register that operates stably by reducing variation in leakage current among flip-flops can be provided.

Embodiment 5

Figure 22:
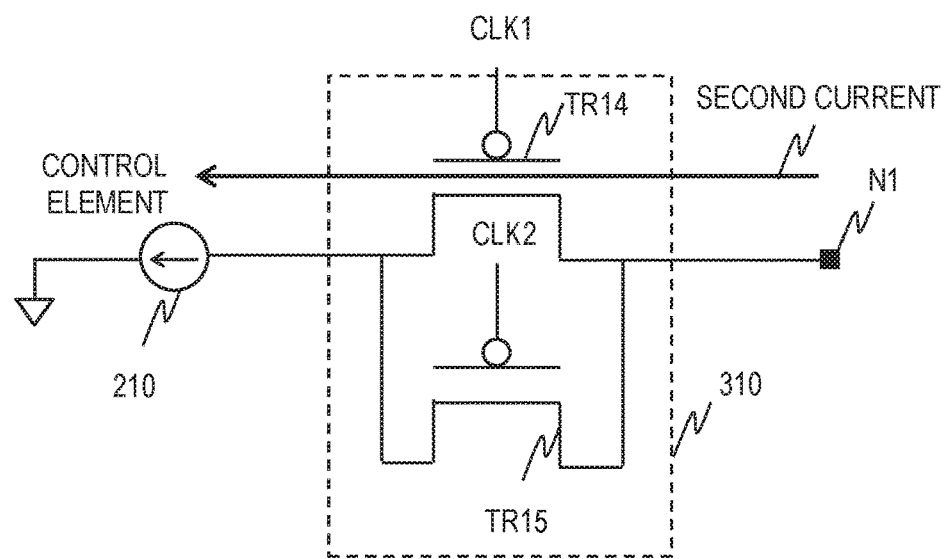
FIG. 22 is a configuration example of a switching circuit in Embodiment 5 to be interposed between a control element and a flip-flop.

FIG. 22 illustrates a configuration example of a switching circuit 310 in Embodiment 5 to be interposed between a control element 210 and a flip-flop. The flip-flop in this embodiment operates in accordance with the timing chart of FIG. 4. As illustrated in FIG. 4, the node N1 is in a floating state during the period from the time T4 to the time T6.

As illustrated in FIG. 22, the switching circuit 310 includes a switch (transistor) TR14 to be controlled by the clock signal CLK1 and a switch (transistor) TR15 to be controlled by the clock signal CLK2 connected in parallel between the node N1 and the control element 210. In the period from the time T4 to the time T6 in which either the clock signal CLK1 or CLK2 is LOW, the switches TR14 and TR15 become active complimentarily; the node N1 and the control element 210 are electrically connected so that the second current flows through the node N1. This embodiment blocks the second current with the switching circuit 310 in the period where the second current is unnecessary and allows the second current to flow only in the period where the node N1 is in a floating state.

As noted from the above, this embodiment saves unnecessary power consumption caused by addition of the control element 210. This embodiment does not need to be activated in every frame. Further, this switching circuit does not need to be connected with every flip-flop in the shift register. Even if this switching circuit is omitted in some stages, the shift register circuit operates normally but the power consumption varies depending on the number of stages of the shift register including this switching circuit.

Figure 23:
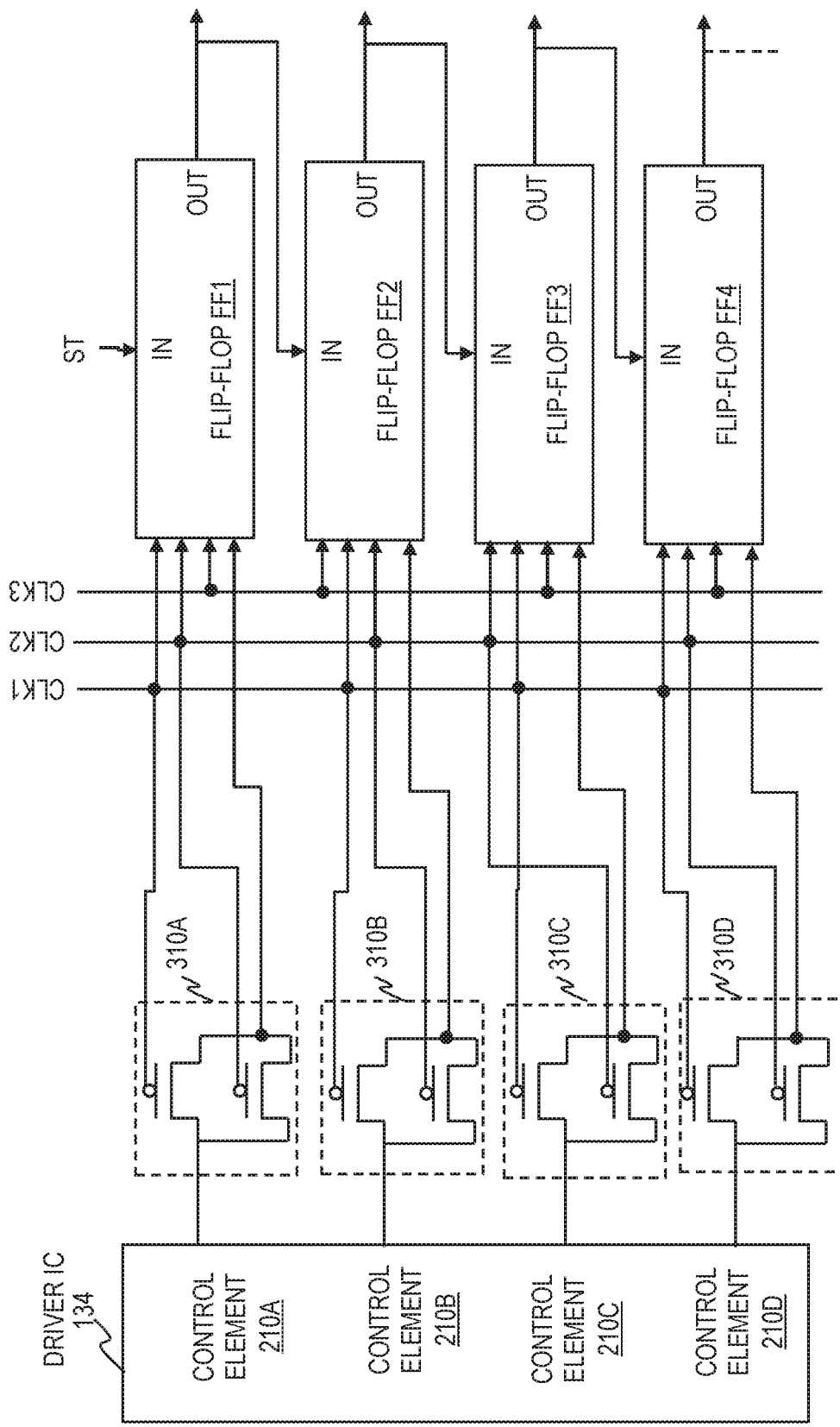
FIG. 23 illustrates a configuration example of a circuit in Embodiment 5 in which a shift register, switching circuits, and control elements are connected.

FIG. 23 illustrates a configuration example of a circuit in this embodiment in which a shift register, switching circuits, and control elements are connected. FIG. 23 includes four stages of flip-flops FF1 to FF4 in a shift register, control elements 210A to 210D for the flip-flops FF1 to FF4, and switching circuits 310A to 310D for switching on/off the electric connection between the flip-flop and the control element. FIG. 23 shows four stages of flip-flops FF1 to FF4 in the shift register. Clock signals CLK1 to CLK3 are input to each flip-flop.

The control elements 210A to 210D in this example are incorporated in the driver IC 134. The control elements 210A to 210D are connected with the flip-flops FF1 to FF4 via the switching circuits 310A to 310D. The switching circuits 310A to 310D are controlled by the clock signals for controlling the flip-flops FF1 to FF4 to allow current to flow between the control element and the flip-flop only in the floating period of the flip-flop. This operation saves the unnecessary power consumption.

Embodiment 6

Figure 24:
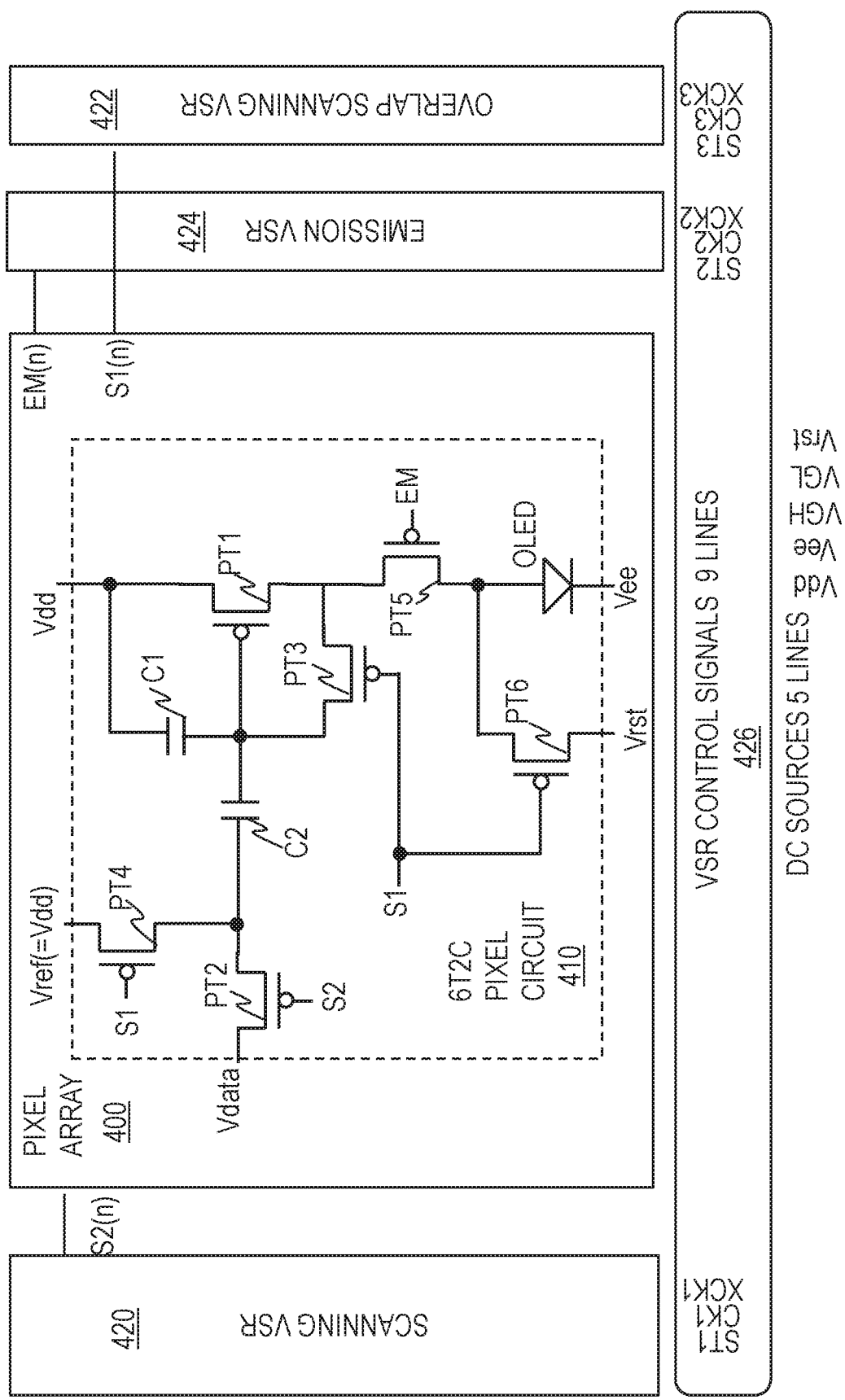
FIG. 24 is a block diagram of an organic EL panel in Embodiment 6.

FIG. 24 is a block diagram of an organic EL panel. A 6T2C pixel circuit 410 for a subpixel is repeatedly disposed to form a pixel array 400. Each pixel circuit 410 includes transistors PT1 to PT6 and capacitors C1 and C2. The pixel circuit 410 is driven by control signals S1(n), S2(n), and Em(n). The control signal S2(n) is supplied from the scanning VSR 420 located on the left of the panel in FIG. 24 to control the transistor to write image data. VSR stands for vertical shift register, which is a shift register for transferring data in the vertical direction. A gate driver in a display device is an example of VSR. The control signal S1(n) is supplied from the overlap scanning VSR 422 on the right of the panel.

Figure 26:
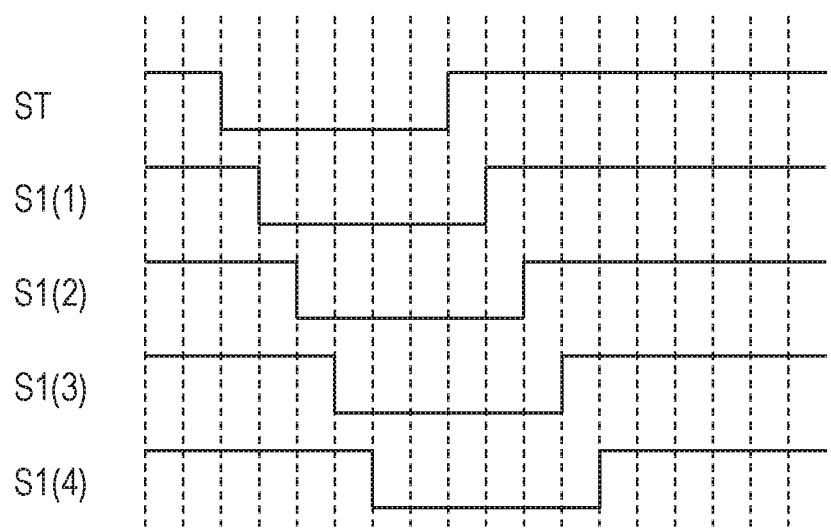
FIG. 26 illustrates waveforms of control signals from an overlap scanning VSR.

The overlap scanning VSR in FIG. 24 has a data transfer cycle of one horizontal period and a pulse width of six horizontal periods as shown in FIG. 26. Overlap scanning is characterized by that active pulses for adjacent lines overlap and a pulse width is longer than a data transfer cycle. In contrast, a common shift register has a data transfer cycle of a length equal to a pulse width.

The control signal Em(n) is supplied from the emission VSR 424 located on the right of the panel. The switch (transistor) to be controlled by the emission VSR is disposed in series between the OLED element and a positive power supply. The OLED element emits light when this switch is open and does not emit light when the switch is closed. The OLED element emits light at a duty ratio of 99% or more and therefore, the emission VSR outputs an active signal for almost all time. The polarity of an active pulse of the emission VSR is opposite to the polarity of an active pulse of the scanning VSR.

Figure 25:
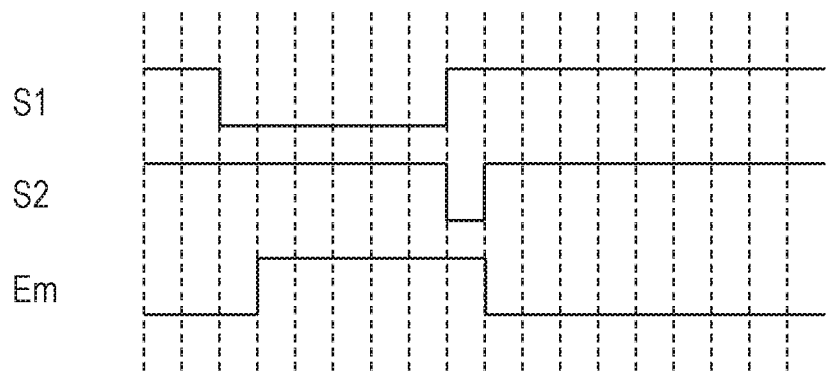
FIG. 25 is a timing chart of control signals S1, S2, and Em for a pixel circuit.
Figure 27:
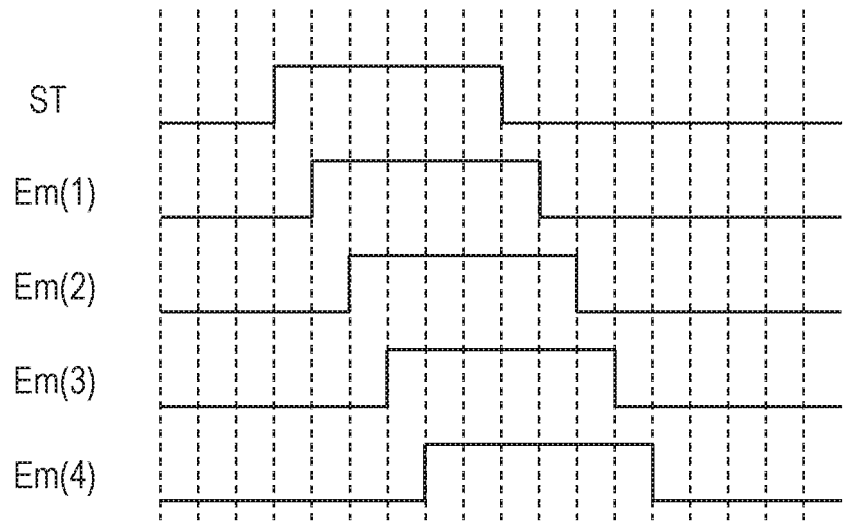
FIG. 27 illustrates waveforms of control signals from an emission VSR.

FIG. 25 is a timing chart of the control signals S1, S2, and Em for a pixel circuit. FIG. 26 illustrates waveforms of the control signals from the overlap scanning VSR 422. The control signals ST and S1(n) are low-active as shown in the waveforms in FIG. 26. FIG. 27 illustrates waveforms of the control signals from the emission VSR 424. The control signals Em(n) are high-active as shown in the waveforms in FIG. 27. All of these control signals have a long pulse such that the active period is six horizontal periods.

Figure 28:
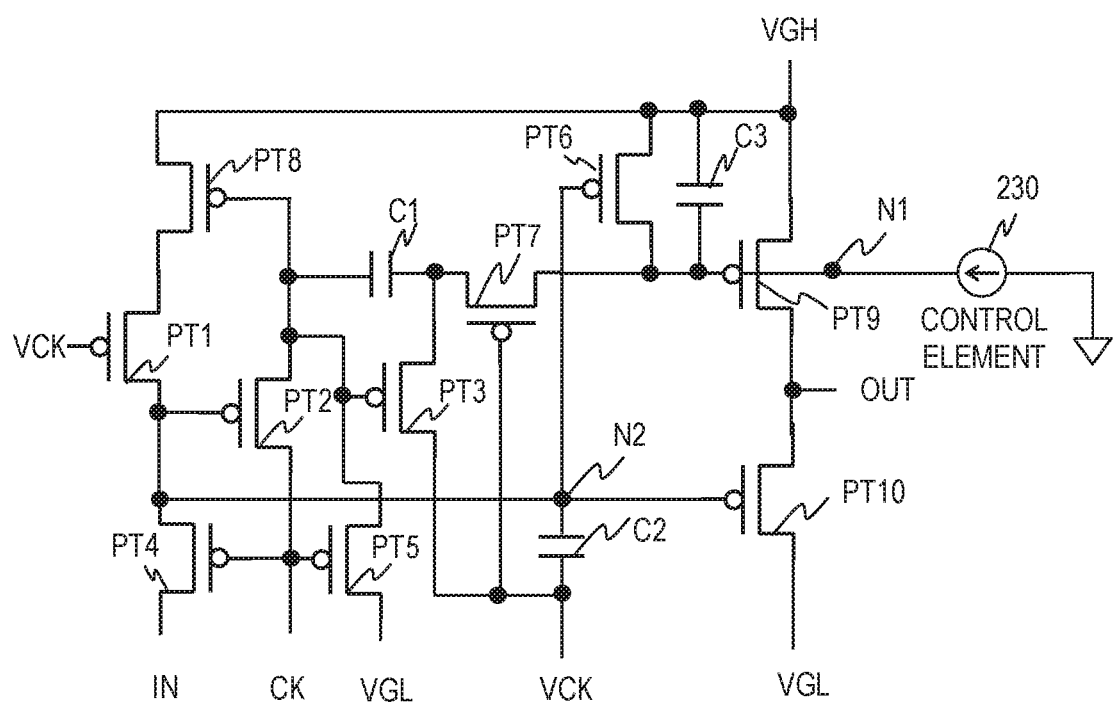
FIG. 28 is a circuit diagram of an example (10T3C configuration) of one stage of a VSR.

FIG. 28 is a circuit diagram of an example (10T3C configuration) of one stage of a VSR. The 10T3C circuit includes p-type field-effect transistors PT1 to PT10 and capacitive elements C1 to C3. The output of the 10T3C circuit is low-active if the input pulse for the 10T3C circuit is low-active; such a 10T3C circuit can be used in the overlap scanning VSR 422. If the input pulse for the 10T3C circuit is high-active, the output of the 10T3C circuit is also high-active; such a 10T3C circuit can be used in the emission VSR 424. A control element 230 is connected to a node N1 in the 10T3C VSR circuit. The control element 230 operates as described in the foregoing embodiments.

Figure 29:
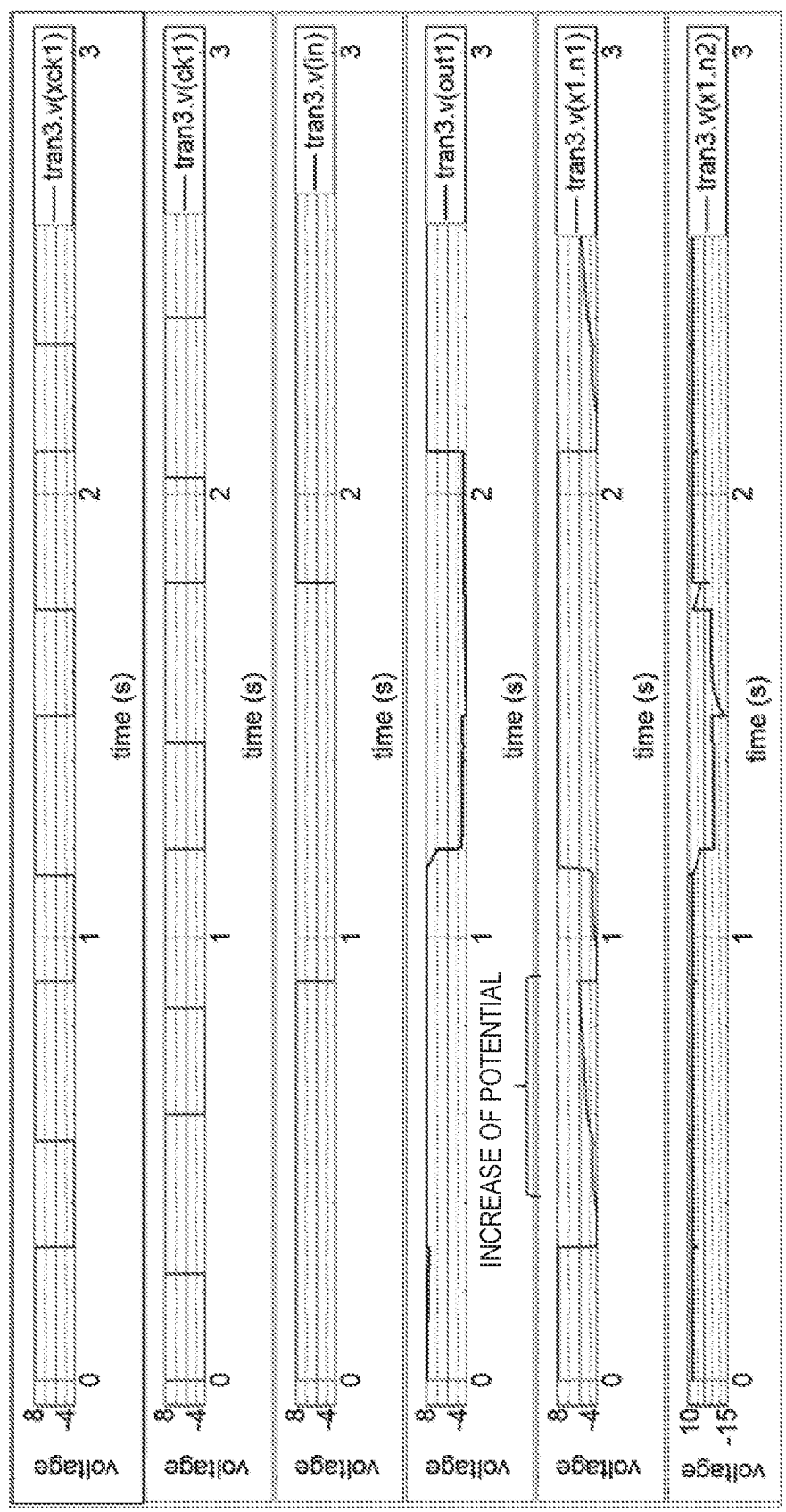
FIG. 29 is a timing chart of clock signals input to the 10T3C VSR circuit and the potentials of the nodes N1 and N2.

FIG. 29 is a timing chart of the clock signals input to the 10T3C VSR circuit together with the potentials of the nodes N1 and N2. FIG. 29 shows the problem that the potential of the node N1 increases with time in the period where the node N1 is in a floating state. Connecting the control element 230 in this embodiment can diminish the increase of the potential. Two clock signals CK1 and XCK1 are supplied. The cycle of these signals is two horizontal periods. In response to a fall of the clock signal CK1 when the input signal IN is active, the output OUT1 falls to the low level. The connections of the clock signals XCK1 and CK1 are replaced with each other between the odd-numbered stages and the even-numbered stages in the VSR. In other words, in response to a fall of the clock signal XCK1, the output OUT2 (not shown) from the second stage falls to the low level.

There is a known technique for an organic EL panel to attain high image quality even if the organic EL panel employs low-temperature polysilicon transistors. This technique determines scale values for the OLED elements inclusive of compensation for the variation in threshold voltage among their driving transistors to eliminate the variation in light emission level among OLED elements. The source-drain current Ids in a transistor employed in this type of display device can be expressed as follows:

$$Ids=\beta/2\cdot(Vgs-Vth)^2$$

$$\beta=\mu\cdot W/L\cdot Cox \qquad (1)$$

In these formulae, Vgs represents the gate-source voltage of this transistor; μ represents the mobility; W represents the channel width; L represents the channel length; Cox represents the capacitance per unit area of the gate insulating film; and Vth represents the threshold voltage. Accordingly, in the case of driving OLED elements with the source-drain currents Ids of transistors by specifying a gate-source voltage Vgs for the transistors, the source-drain currents Ids are affected by the variation in threshold voltage Vth to vary. As a result, the light emission levels of the OLED elements also vary. Now, the following relational expression can be obtained by replacing the source-drain current Ids and the gate-source voltage Vgs with Iref and Vref, respectively, and transforming the formula (1):

$$Vref=(Iref/(\beta/2))^{1/2}+Vth \qquad (2)$$

Accordingly, when the gate-source voltage Vgs is determined using a differential voltage (Vdata−Vref) between a voltage Vdata representing the luminance of the light to be emitted from the OLED element and the voltage Vref obtained by the formula (2), the following relational expression can be obtained from the formula (1):

$$Ids=\beta/2\cdot(Vdata-(Iref/(\beta/2))^{1/2})^2 \qquad (3)$$

This formula (3) does not include a term of the threshold voltage Vth, which indicates that the variation in luminance of emitted light caused by the variation in threshold voltage Vth is eliminated. Accordingly, the variation in luminance of emitted light caused by the variation in threshold voltage Vth can be eliminated by biasing the gate-source voltage Vgs and the source-drain current Ids of the transistor driving an OLED element by the constant voltage Vref and the constant current Iref calculated from the characteristics of the transistor by the formula (2).

In the case of Iref=0, the formula (2) is rewritten as Vref=Vth and the formula (3) is rewritten as Ids=β/2·(Vdata)². These formulae also indicate that the variation in luminance of emitted light caused by the variation in threshold voltage Vth is eliminated. These formulae indicate that the variation in luminance of emitted light caused by the variation in threshold voltage Vth can be compensated for by biasing only the gate-source voltage Vgs. The compensation for the variation in threshold voltage among driving transistors is based on this principle.

Figure 30:
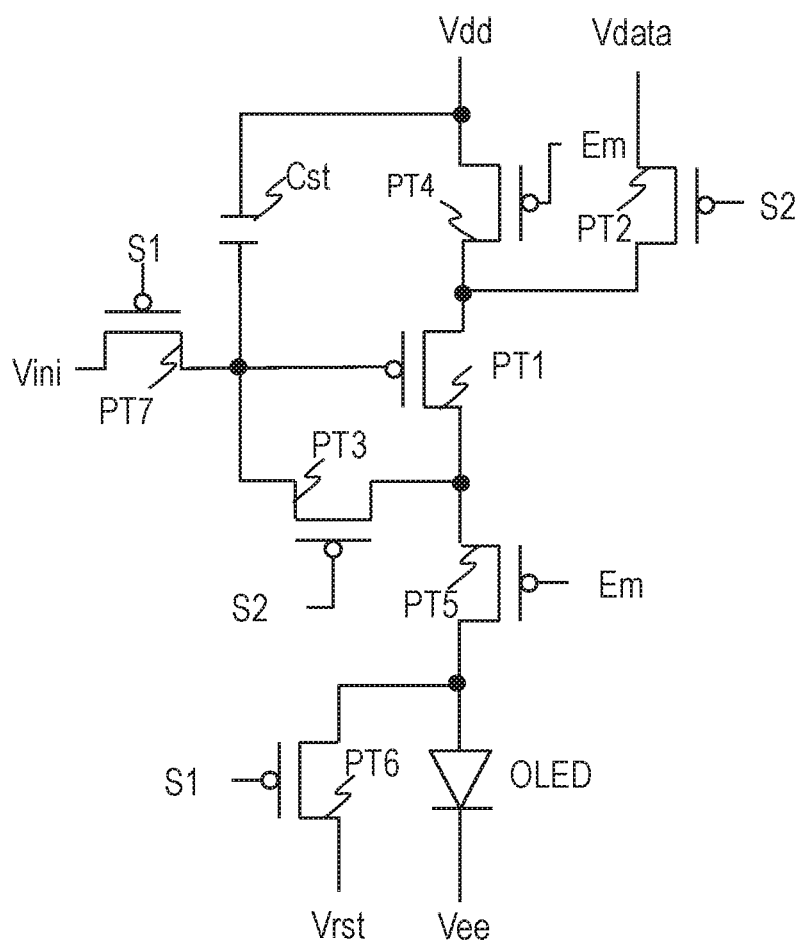
FIG. 30 illustrates a configuration example of a 7T1C pixel circuit.
Figure 31:
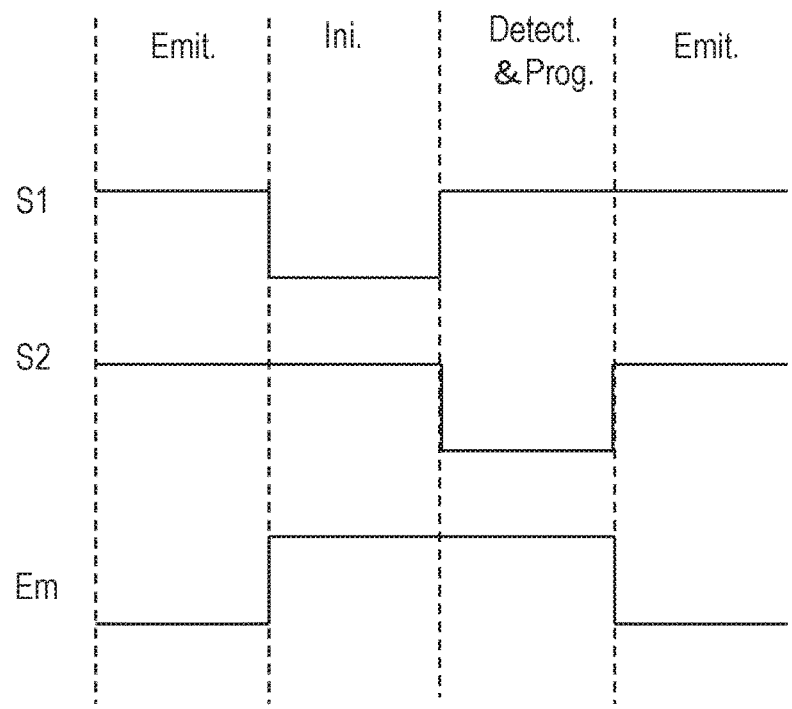
FIG. 31 is a timing chart of signals in the 7T1C pixel circuit.

A 7T1C pixel circuit performs threshold detection and data write concurrently. FIG. 30 illustrates a configuration example of a 7T1C pixel circuit and FIG. 31 is a timing chart of the signals in the 7T1C pixel circuit. As illustrated in FIG. 30, the 7T1C pixel circuit includes seven transistors PT1 to PT7 for controlling light emission of the OLED element and one capacitor (storage capacitor) Cst. The signals S1, S2, and Em change over an initialization period (Ini.), a threshold detection and data write period (Detect. & Prog.), and a light emission period (Emit.) as shown in FIG. 31.

Figure 32:
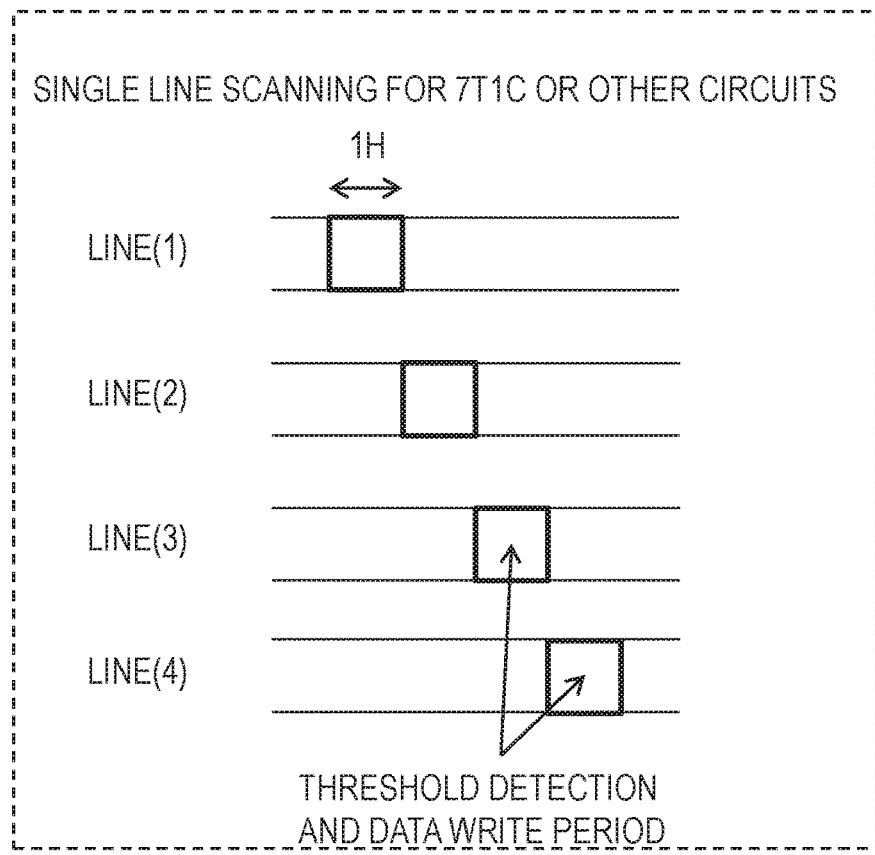
FIG. 32 illustrates data write and threshold detection periods in 7T1C pixel circuits in a plurality of rows.

FIG. 32 illustrates data write and threshold detection periods of 7T1C pixel circuits in a plurality of rows. A common pixel circuit like the 7T1C pixel circuit for a display device has a limitation in data write period to one horizontal period because image data cannot be shared by different lines. Accordingly, the period for threshold detection is also limited to one horizontal period. Furthermore, one horizontal period becomes shorter as the resolution increases. For these reasons, threshold detection might not be performed sufficiently.

Figure 33:
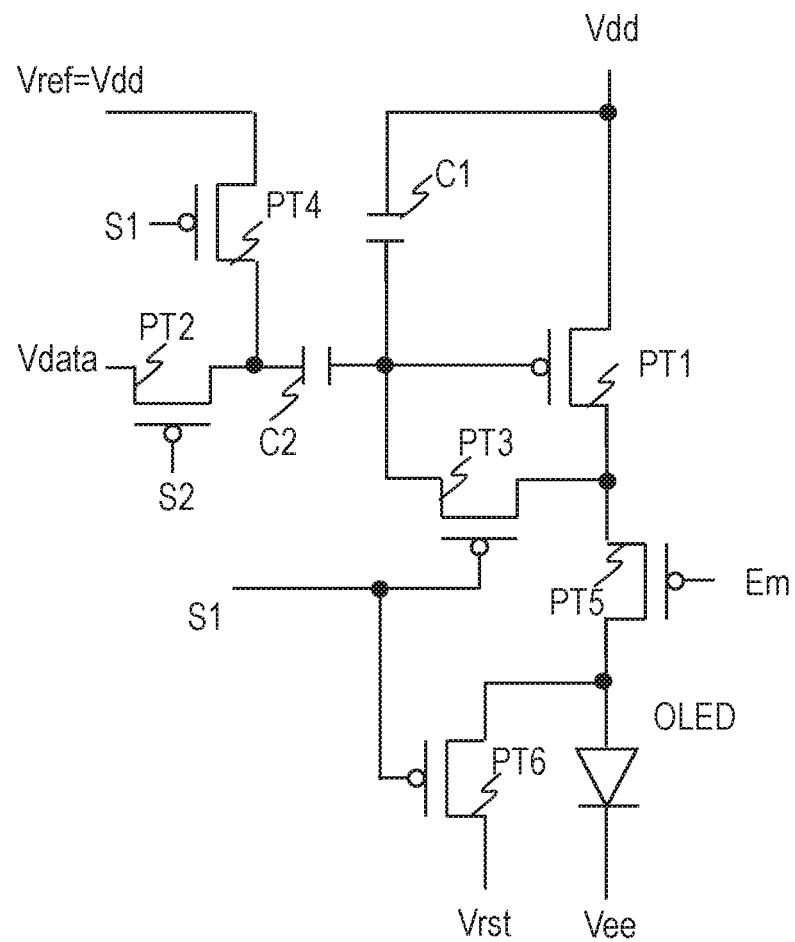
FIG. 33 illustrates a configuration example of a 6T2C pixel circuit.
Figure 34:
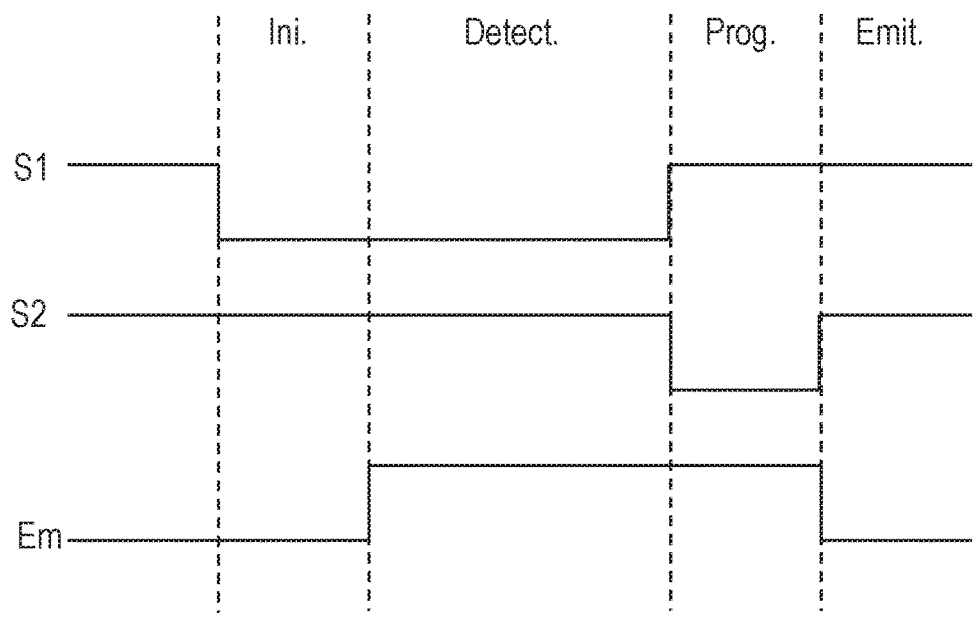
FIG. 34 is a timing chart of signals in the 6T2C pixel circuit.

A 6T2C pixel circuit, however, employs time sharing to perform threshold detection and data write. FIG. 33 illustrates a configuration example of a 6T2C pixel circuit and FIG. 34 is a timing chart of the signals in the 6T2C pixel circuit. As illustrated in FIG. 33, the 6T2C pixel circuit includes six transistors PT1 to PT6 for controlling light emission of the OLED element and two capacitive elements C1 and C2. The signals S1, S2, and Em change over an initialization period (Ini.), a threshold detection period (Detect.), a data write period (Prog.), and a light emission period (Emit.) as shown in FIG. 34.

Figure 35:
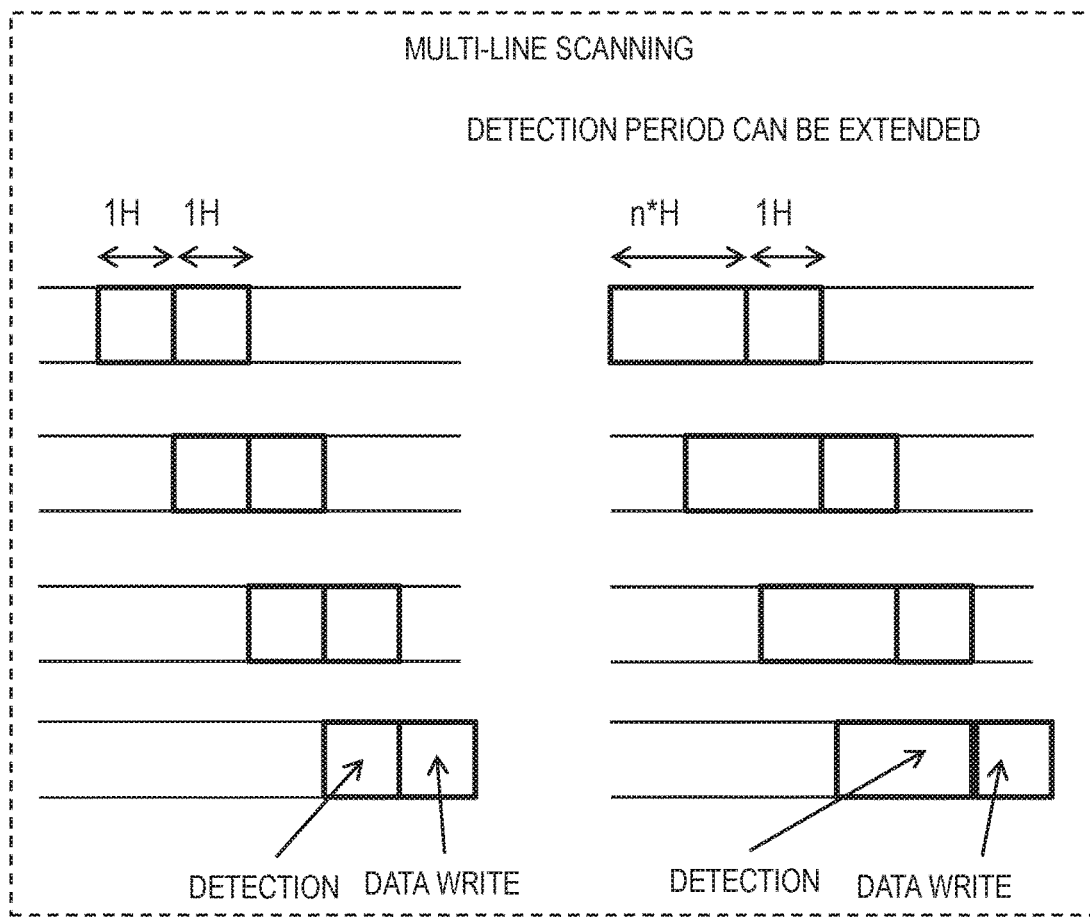
FIG. 35 illustrates threshold detection periods and data write periods in 6T2C pixel circuits in a plurality of rows.

FIG. 35 illustrates threshold detection periods and data write periods of 6T2C pixel circuits in a plurality of rows. The threshold detection periods are separate from the data write periods. Although a data write period is limited to one horizontal period, a threshold detection period can be determined to have a desired length. That is to say, a sufficient plurality of horizontal scanning periods can be secured to perform compensation for the variation in threshold voltage Vth. As illustrated in FIG. 35, the threshold detection period can be an integral multiple of a data write (image sampling) period, such as one horizontal period, two horizontal periods, and the like.

FIGS. 36A to 36D schematically illustrate operation in the initialization period (Ini.), the threshold detection period (Detect.), the data write period (Prog.), and the light emission period (Emit.) in the timing chart of FIG. 34. FIGS. 36A to 36D illustrate schematic equivalent circuits without showing closed transistors (switches).

Figure 36A:
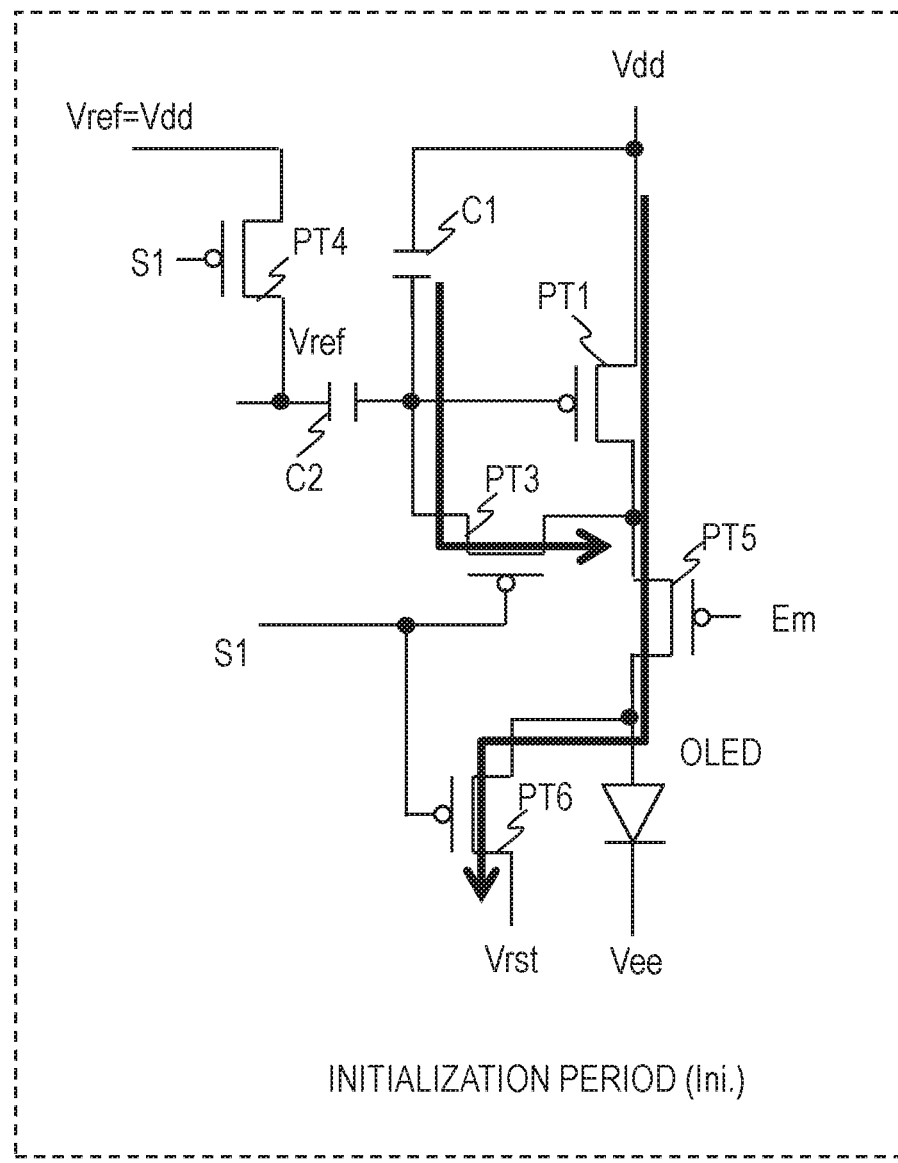
FIG. 36A schematically illustrates operation of a 6T2C pixel circuit in an initialization period.

In the initialization period (Ini.) illustrated in FIG. 36A, all transistors except for the transistor PT2 are ON; electric currents flow as indicated by the arrowed lines. The capacitive element C1 is discharged so that the gate voltage of the driving transistor PT1 is initialized (reset). Concurrently, a through-current flows from the positive power supply Vdd toward Vrst so that the anode voltage of the OLED is initialized. The potentials of these nodes fall close to the potential of the negative power supply Vee. This period is to prepare for the subsequent threshold detection period and to prevent abnormal light emission in a period other than the light emission period.

Figure 36B:
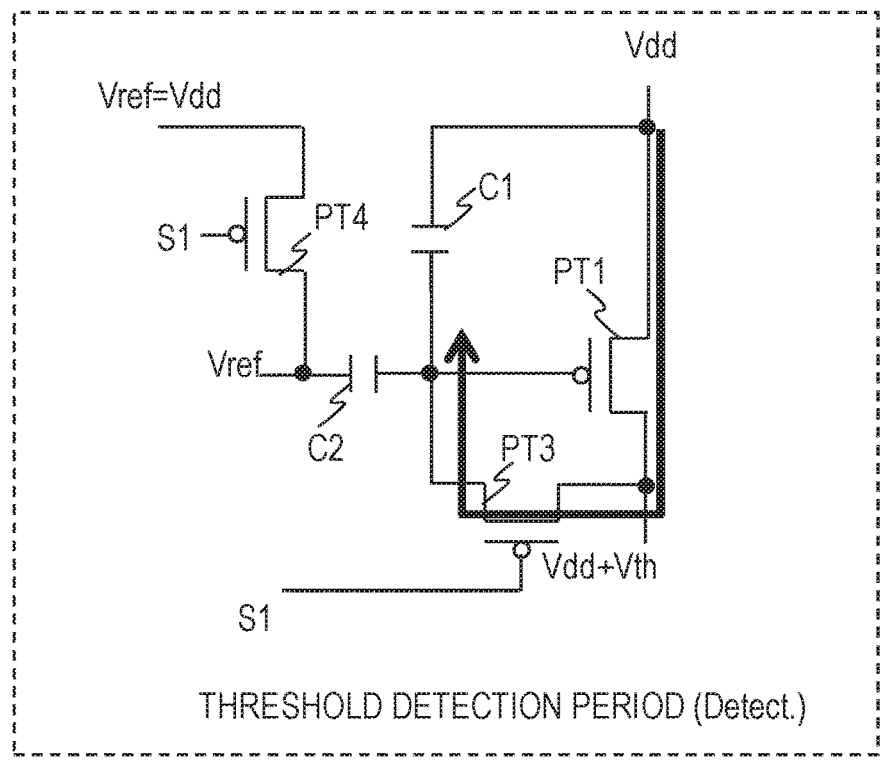
FIG. 36B schematically illustrates operation of a 6T2C pixel circuit in a threshold detection period.

Next, in the threshold detection period (Detect.) in FIG. 36B, the drain and the gate of the driving transistor PT1 are connected to be in so-called diode-connection. The driving transistor PT1 is discharged from the gate so that the drain current flowing from the driving transistor PT1 decreases. After elapse of a sufficient time, the drain current stops flowing so that the gate-source voltage of the driving transistor PT1 reaches down to the threshold voltage. Since the source potential is Vdd, the gate potential becomes Vdd+Vth.

Figure 36C:
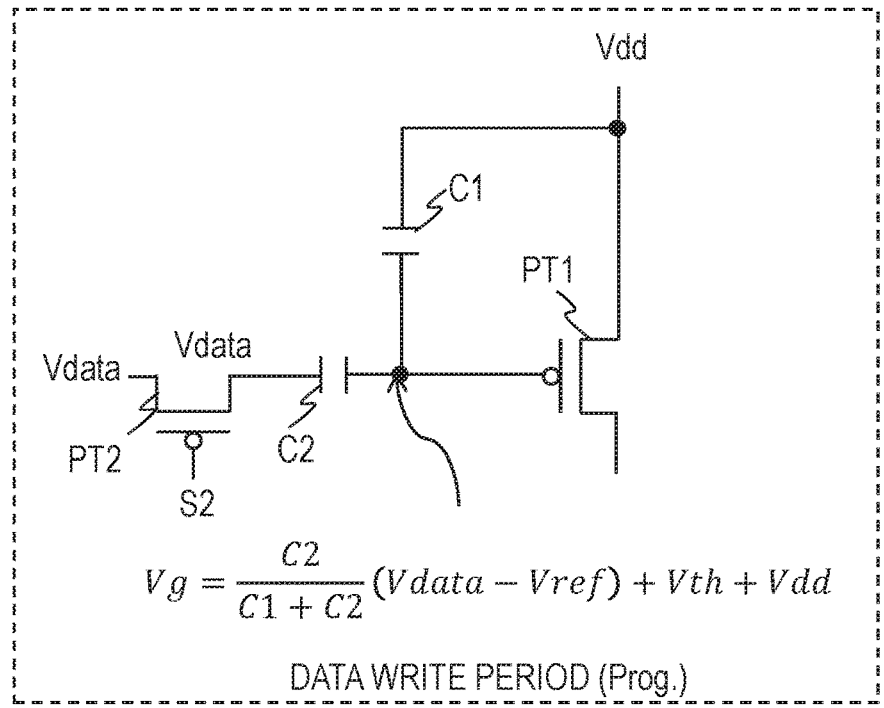
FIG. 36C schematically illustrates operation of a 6T2C pixel circuit in a data write period.

Next, in the data write period (Prog.) in FIG. 36C, a data voltage Vdata is applied to the left side of the capacitive element C2, so that the potential there changes from Vref to Vdata. The gate potential of the driving transistor PT1 takes a value expressed by the formula shown in FIG. 36C because of charge conservation. This formula includes the threshold voltage Vth of the driving transistor and this potential is retained by the capacitive element C1.

Figure 36D:
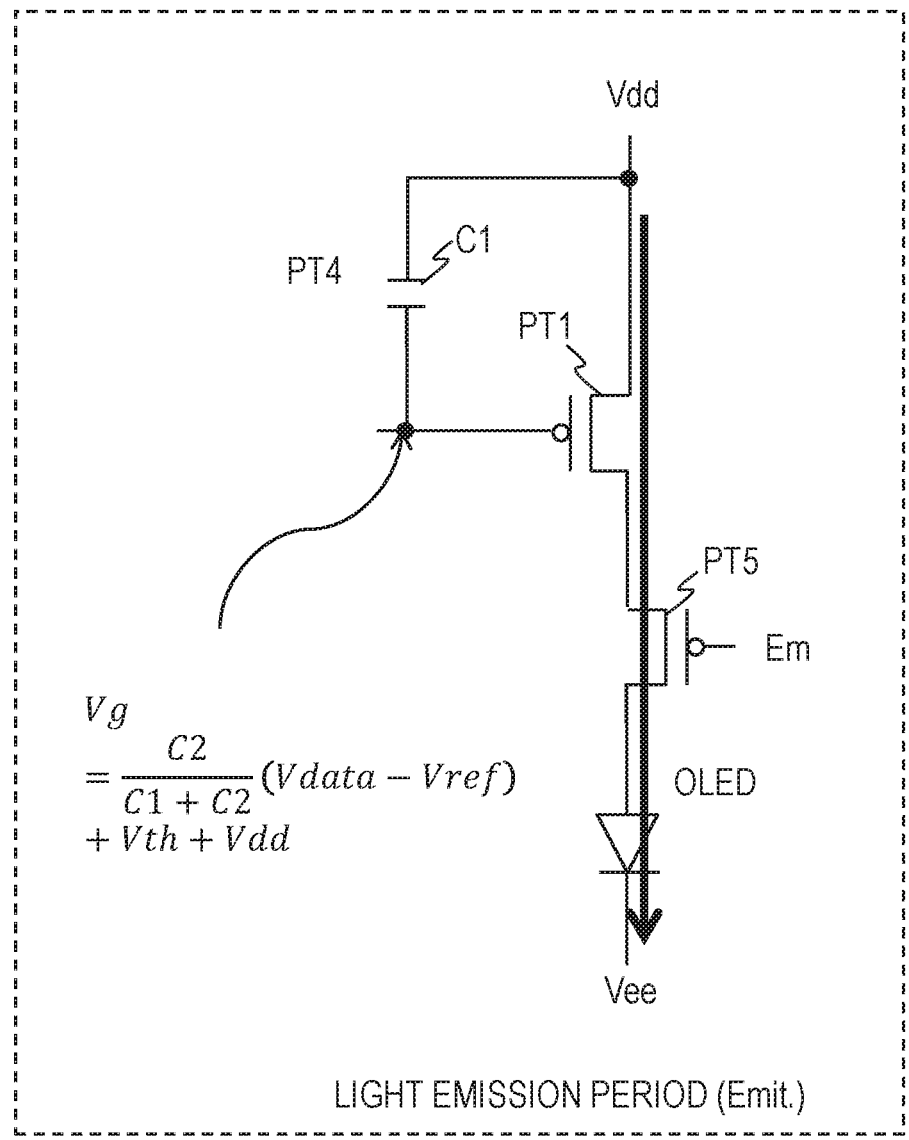
FIG. 36D schematically illustrates operation of a 6T2C pixel circuit in a light emission period.

Next, the light emission period (Emit.) is described with reference to FIG. 36D. Substituting Vg and Vs into the formula of the current Ioled of the driving transistor PT1 (OLED) results in the formula of Ioled without the term of Vth. That is to say, the current Ioled does not depend on the threshold voltage Vth and can be controlled by the data voltage Vdata. The current does not vary even if the threshold voltage Vth varies among driving transistors, and accordingly, even and uniform light emission is available.

Figure 37:
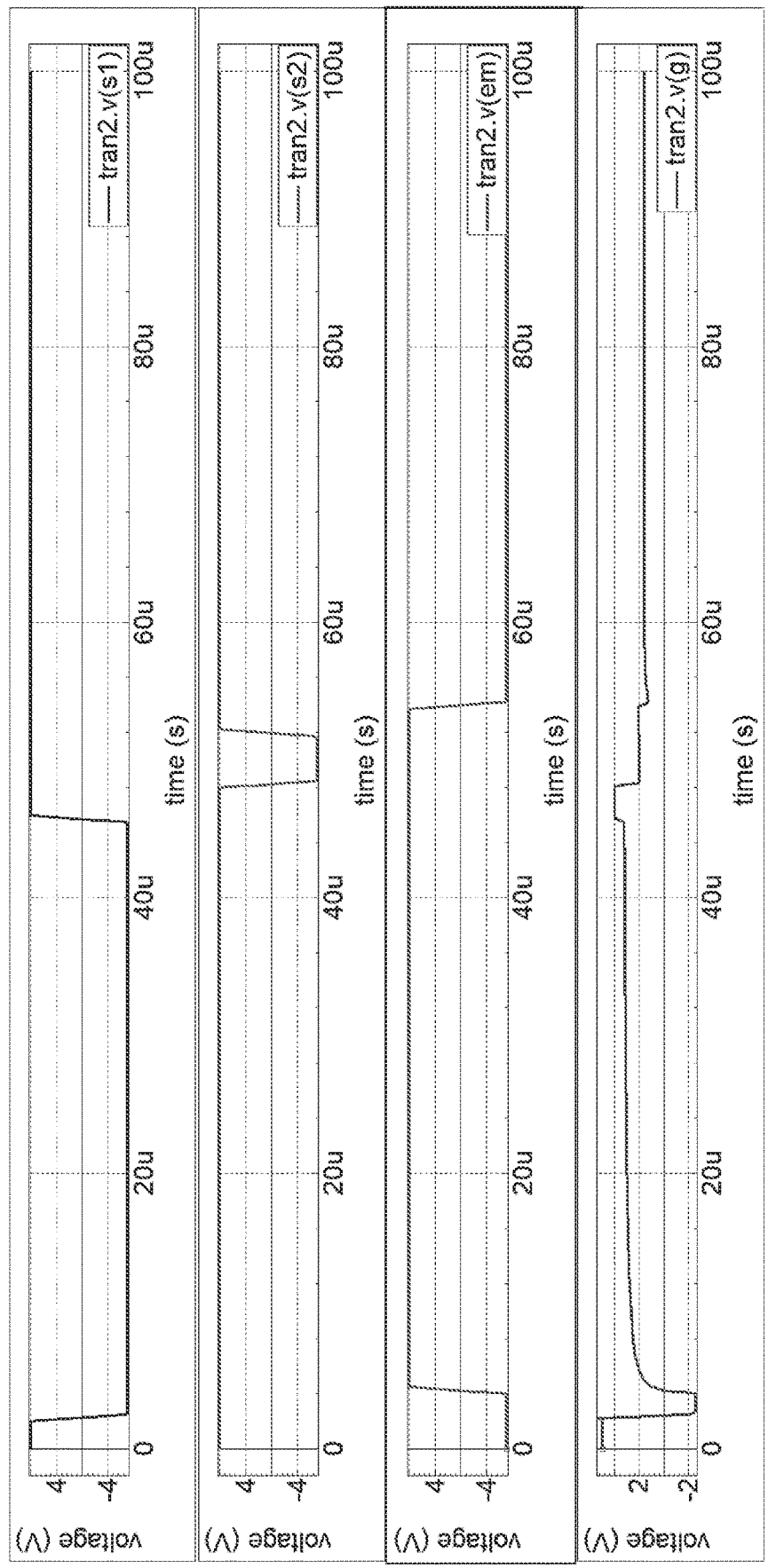
FIG. 37 illustrates a simulation result of operation of a 6T2C pixel circuit.

A result of simulation is shown in FIG. 37. The waveforms are of the signal S1, the signal S2, and the signal Em from the top toward the bottom. The lowermost waveform is of the gate potential of the driving transistor. The gate potential of the driving transistor falls close to the negative power-supply potential in the initialization period. In the subsequent threshold detection period, the gate potential of the driving transistor gradually increases with time and approaches the value of Vdd+Vth. In the data write period, image data information is written to the gate of the driving transistor and the potential there changes in accordance with the value of Vdata. In the light emission period, the gate potential of the driving transistor is fixed at the value to emit light.

As described above, a pixel circuit performs operation to write image data to the storage capacitor in the horizontal scanning period allocated for the corresponding row (a data write period). The pixel circuit performs corrective operation to write a voltage for canceling the threshold voltage to the storage capacitor, utilizing the previous horizontal scanning periods allocated for previous rows (a threshold detection period). The pixel circuit separates the threshold detection period from the data write period. The threshold detection period has a length of an integral multiple of the data write period.

The control elements in this description can be used for an overlap scanning VSR. The foregoing embodiments are applicable to driving with a signal having a wide pulse width as long as an integral multiple of one horizontal period, like overlap scanning. The overlap scanning VSR is a type of VSR; the circuit configuration for adjusting the pulse width depends on the design.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A circuit comprising:
   a flip-flop included in a multi-stage shift register; and
   a control element,
   wherein the flip-flop includes:
      an output field-effect transistor;
      a first field-effect transistor configured to operate to supply one of a high potential and a low potential to the gate of the output field-effect transistor; and
      a second field-effect transistor configured to operate to supply the other one of the high potential and the low potential to the gate of the output field-effect transistor, and
   wherein the control element is configured to operate to make an electric current flow between the gate and a power supply in the opposite direction of an off-leakage current from at least either one of the first field-effect transistor and the second field-effect transistor in a period where the first field-effect transistor and the second field-effect transistor are off.

2. The circuit according to claim 1, wherein the control element includes a third field-effect transistor in an OFF state.

3. The circuit according to claim 2, wherein the first field-effect transistor, the second field-effect transistor, and the third field-effect transistor has the same conductivity type.

4. The circuit according to claim 2, wherein conductivity of the third field-effect transistor is equal to or higher than the sum of conductivity of the first field-effect transistor and the second field-effect transistor.

5. The circuit according to claim 1, wherein the control element includes a plurality of third field-effect transistors in an OFF state connected in parallel between the gate and the power supply.

6. The circuit according to claim 5, wherein the sum of conductivity of the plurality of third field-effect transistors is equal to or higher than the sum of conductivity of the first field-effect transistor and the second field-effect transistor.

7. The circuit according to claim 1, wherein the output field-effect transistor is configured to output a base potential in relation to a potential of data to be transferred.

8. The circuit according to claim 1,
wherein the first field-effect transistor is configured to:
be on for a first period to supply the one potential to the gate of the output field-effect transistor; and
be off for a second period subsequent to the first period; and
repeat the first period and the second period alternately,
wherein the second field-effect transistor is configured to be on for a third period included in the second period and shorter than the second period to supply the other potential to the gate of the output field-effect transistor, and
wherein the control element is configured to operate to make an electric current flow between the gate and the power supply in the opposite direction in the first period and the second period.

9. The circuit according to claim 1, wherein the output field-effect transistor is configured to output a potential of data to be transferred.

10. The circuit according to claim 1,
wherein the first field-effect transistor is configured to:
be off in a fourth period; and
be on in a fifth period subsequent to the fourth period to supply the one potential to the gate of the output field-effect transistor; and
repeat the fourth period and the fifth period alternately,
wherein the second field-effect transistor is configured to be on for a sixth period included in the fourth period and shorter than the fourth period to supply the other potential to the gate of the output field-effect transistor, and
wherein the control element is configured to operate to make the electric current flow between the gate and the power supply in the opposite direction in the fourth period and the fifth period.

11. The circuit according to claim 1, further comprising a limiter field-effect transistor at a location between the first field-effect transistor and the gate, between the second field-effect transistor and the gate, and the control element and the gate,
wherein the output field-effect transistor is configured to output a potential of data in an output period in which one of a potential higher than the high potential and a potential lower than the low potential is being supplied to the gate, and
wherein the limiter transistor is configured to:
be off in the output period;
be on in a period where the first field-effect transistor is supplying one of the high potential and the low potential to the gate; and
be on in a period where the second field-effect transistor is supplying the other one of the high potential and the low potential to the gate.

12. The circuit according to claim 1, wherein the control element is an electric current supply circuit adjustable in current value.

13. The circuit according to claim 1, further comprising a switching circuit to pass or block an electric current,
wherein the switching circuit is controlled by a clock signal controlling the flip-flop.

14. The circuit according to claim 1, wherein the flip-flop is included in an overlap scanning vertical shift register or an emission vertical shift register.

15. The circuit according to claim 1,
wherein the circuit is configured to:
perform a write operation of writing image data to a storage capacitor in a horizontal scanning period allocated for a row; and
perform a corrective operation of writing a voltage for cancelling a threshold voltage to the storage capacitor, utilizing previous horizontal scanning periods allocated for rows preceding the row,
wherein the period to perform the corrective operation and the period to perform the write operation are separate, and
wherein the period to perform the corrective operation is as long as an integer multiple of the period to perform the write operation.

* * * * *